US011506934B2

(12) United States Patent
Nakabayashi et al.

(10) Patent No.: US 11,506,934 B2
(45) Date of Patent: Nov. 22, 2022

(54) LIGHT-EMITTING DEVICE AND PLANAR LIGHT SOURCE

(71) Applicant: NICHIA CORPORATION, Anan (JP)

(72) Inventors: Takuya Nakabayashi, Tokushima (JP); Ryohei Yamashita, Tokushima (JP); Keiji Emura, Anan (JP); Tsuyoshi Okahisa, Tokushima (JP); Toshinobu Katsumata, Fujiyoshida (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 17/446,388

(22) Filed: Aug. 30, 2021

(65) Prior Publication Data

US 2022/0066267 A1 Mar. 3, 2022

(30) Foreign Application Priority Data

Aug. 31, 2020 (JP) ............................. JP2020-146125

(51) Int. Cl.
*G02F 1/13357* (2006.01)
*G02F 1/1335* (2006.01)

(52) U.S. Cl.
CPC .. *G02F 1/133605* (2013.01); *G02F 1/133606* (2013.01); *G02F 1/133612* (2021.01)

(58) Field of Classification Search
CPC ......... G02F 1/133605; G02F 1/133612; G02F 1/133606
See application file for complete search history.

(56) References Cited

U.S. PATENT DOCUMENTS

| 2008/0303977 A1 | 12/2008 | Sekiguchi et al. |
| 2011/0051044 A1 | 3/2011 | Segawa |
| 2011/0051411 A1 | 3/2011 | Kim et al. |
| 2011/0149198 A1 | 6/2011 | Kim et al. |

(Continued)

FOREIGN PATENT DOCUMENTS

| EP | 3340297 A1 * | 6/2018 | ............ F21V 7/0083 |
| JP | 2007048883 A | 2/2007 | |

(Continued)

*Primary Examiner* — Anabel Ton
(74) *Attorney, Agent, or Firm* — Hunton Andrews Kurth LLP

(57) ABSTRACT

A light-emitting device includes a wiring board, a plurality of light-emitting elements disposed on the wiring board, a light-reflecting member covering a lateral surface of each of the plurality of light-emitting elements, a plurality of light-transmitting layers each located above an emission surface of a corresponding one of the plurality of light-emitting elements, a plurality of light-reflecting layers disposed on the plurality of light-transmitting layers, respectively, a light-diffusing layer disposed above the plurality of light-reflecting layers and the light-reflecting member, and a low-refractive-index layer located between the light-reflecting member and the light-diffusing layer, around each pair of one of the plurality of light-transmitting layers and one of the light-reflecting layers, and having a refractive index lower than that of the plurality of light-transmitting layers. Each of the plurality of light-reflecting layer has a width in a cross-sectional view thereof which is equal to or greater than that of a corresponding one of the plurality of light-transmitting layers.

20 Claims, 19 Drawing Sheets

(56) References Cited

U.S. PATENT DOCUMENTS

| | | |
|---|---|---|
| 2011/0317096 A1 | 12/2011 | Yokota et al. |
| 2012/0224111 A1 | 9/2012 | Ohshima |
| 2014/0070249 A1 | 3/2014 | Yoon et al. |
| 2014/0071689 A1 | 3/2014 | Yoon et al. |
| 2015/0102366 A1 | 4/2015 | Wada |
| 2015/0155450 A1 | 6/2015 | Oka |
| 2016/0348876 A1 | 12/2016 | Azuma et al. |
| 2017/0154880 A1 | 6/2017 | Ozeki et al. |
| 2018/0182940 A1 | 6/2018 | Yamamoto et al. |
| 2019/0097094 A1 | 3/2019 | Han et al. |
| 2019/0243187 A1 | 8/2019 | Liu |

FOREIGN PATENT DOCUMENTS

| | | | |
|---|---|---|---|
| JP | 2008304839 A | 12/2008 | |
| JP | 2010238846 A | 10/2010 | |
| JP | 2010277983 A | 12/2010 | |
| JP | 2011053543 A | 3/2011 | |
| JP | 2011096494 A | 5/2011 | |
| JP | 2012182023 A | 9/2012 | |
| JP | 2012221732 A | 11/2012 | |
| JP | 2012227470 A | 11/2012 | |
| JP | 2012243822 A | 12/2012 | |
| JP | 2013503431 A | 1/2013 | |
| JP | 2013038136 A | 2/2013 | |
| JP | 2014057061 A | 3/2014 | |
| JP | 2014057062 A | 3/2014 | |
| JP | 2015079805 A | 4/2015 | |
| JP | 2015106641 A | 6/2015 | |
| JP | 2016225501 A | 12/2016 | |
| JP | 2017108092 A | 6/2017 | |
| JP | 2018056367 A | 4/2018 | |
| JP | 2018107257 A | 7/2018 | |
| JP | 2019061954 A | 4/2019 | |

\* cited by examiner

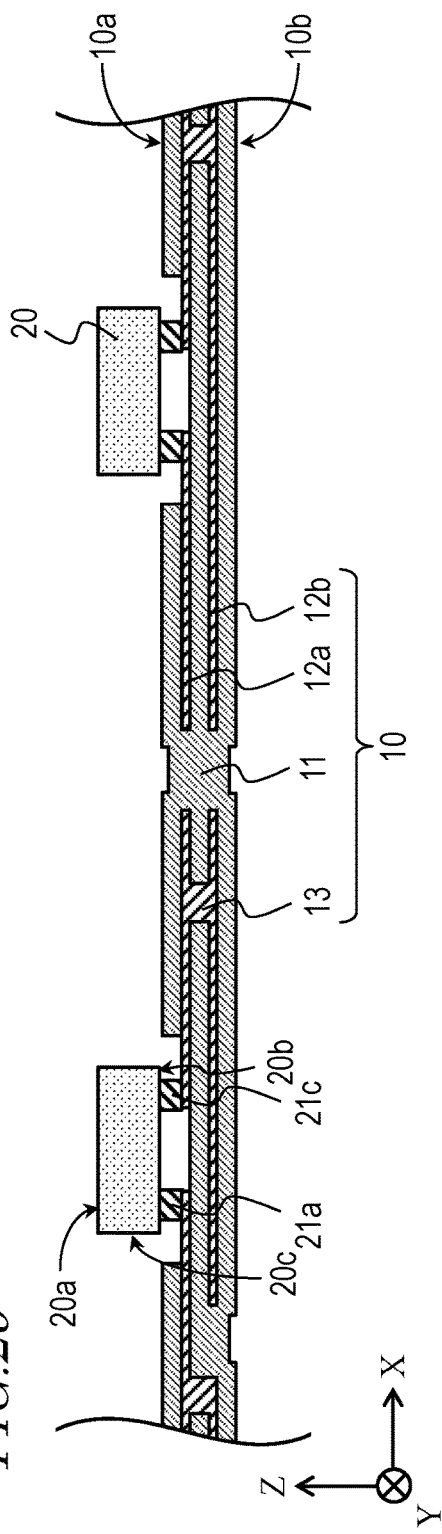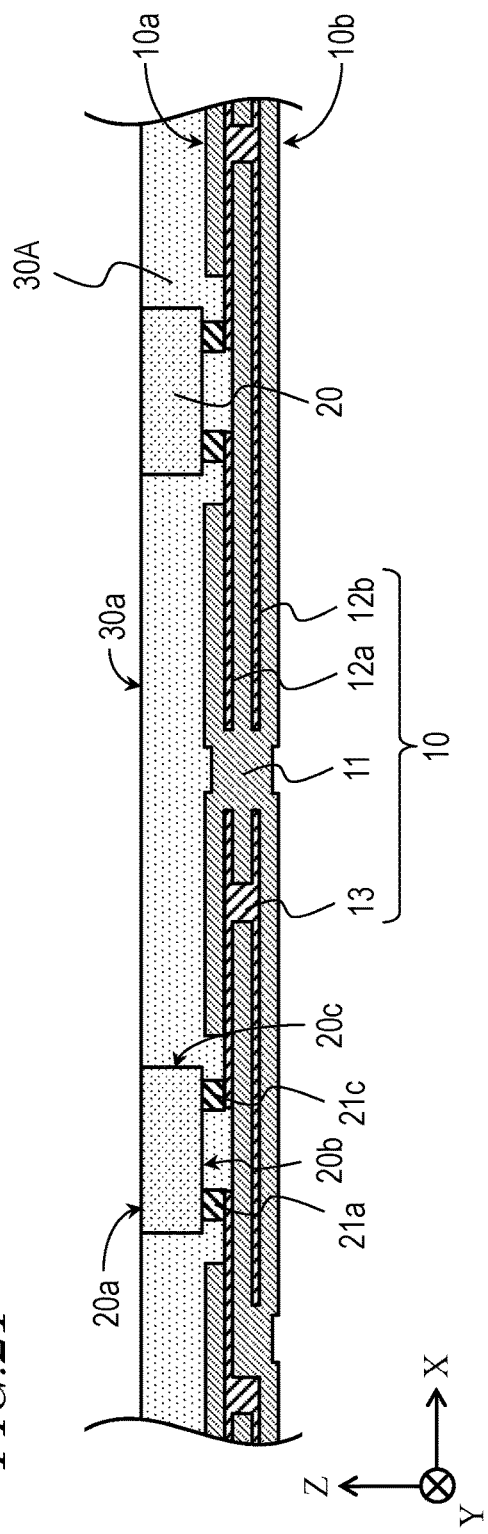

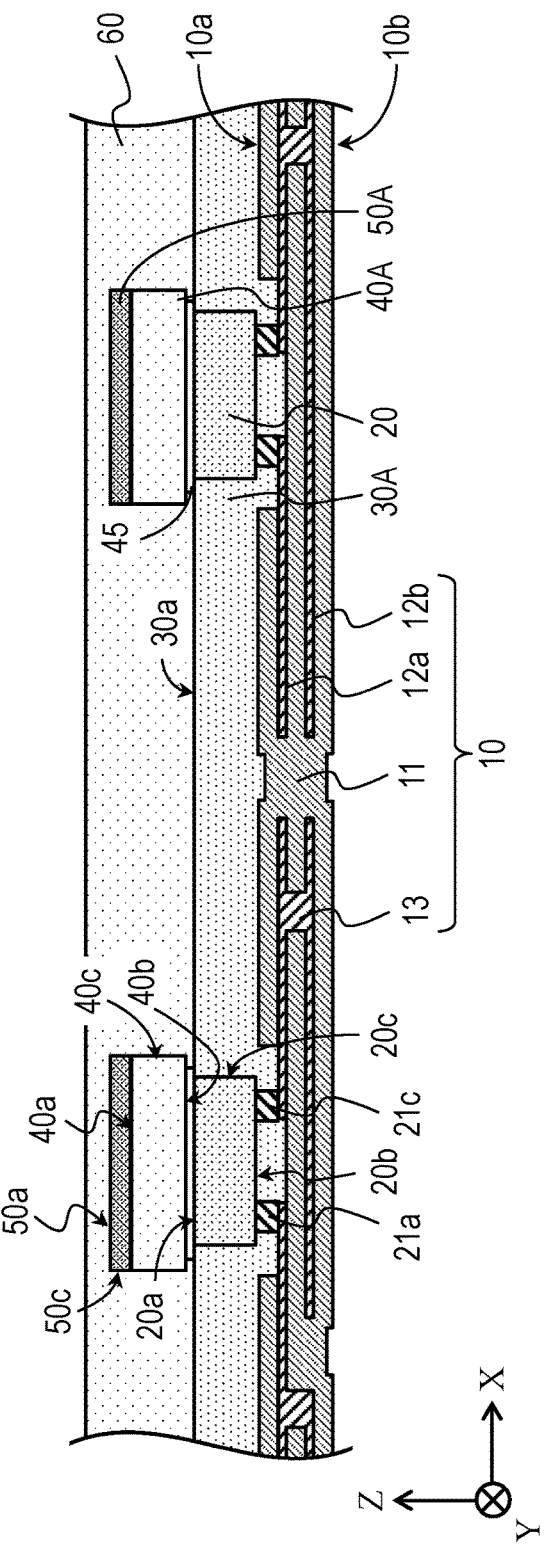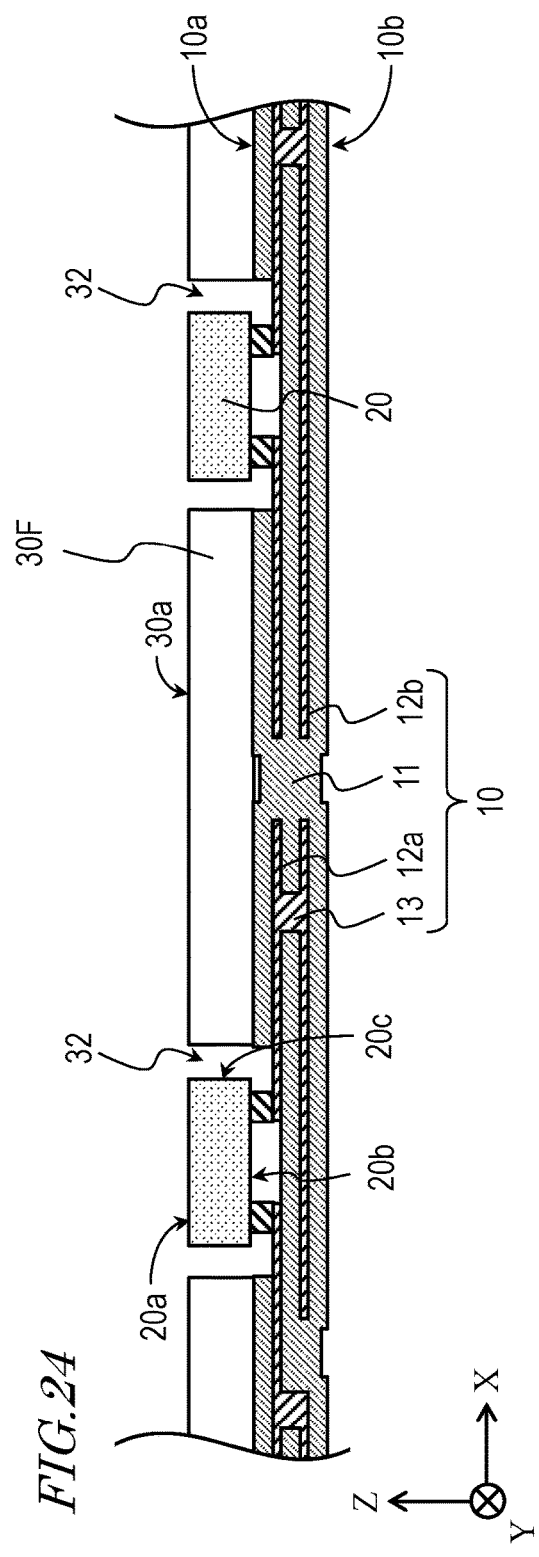

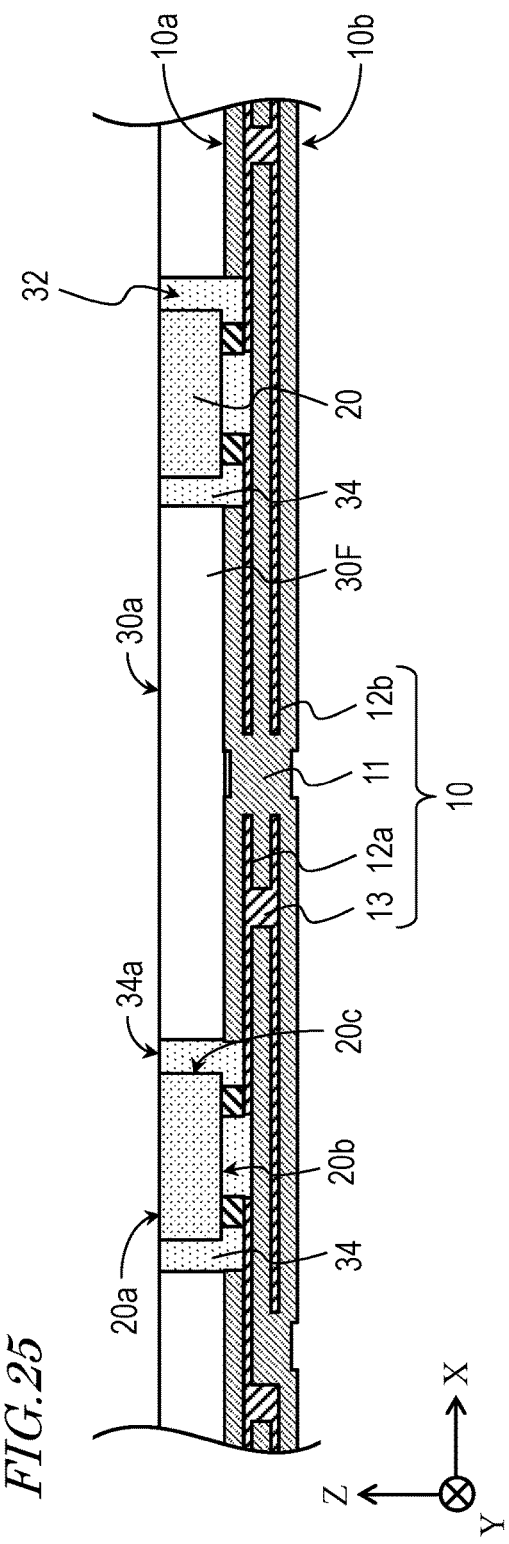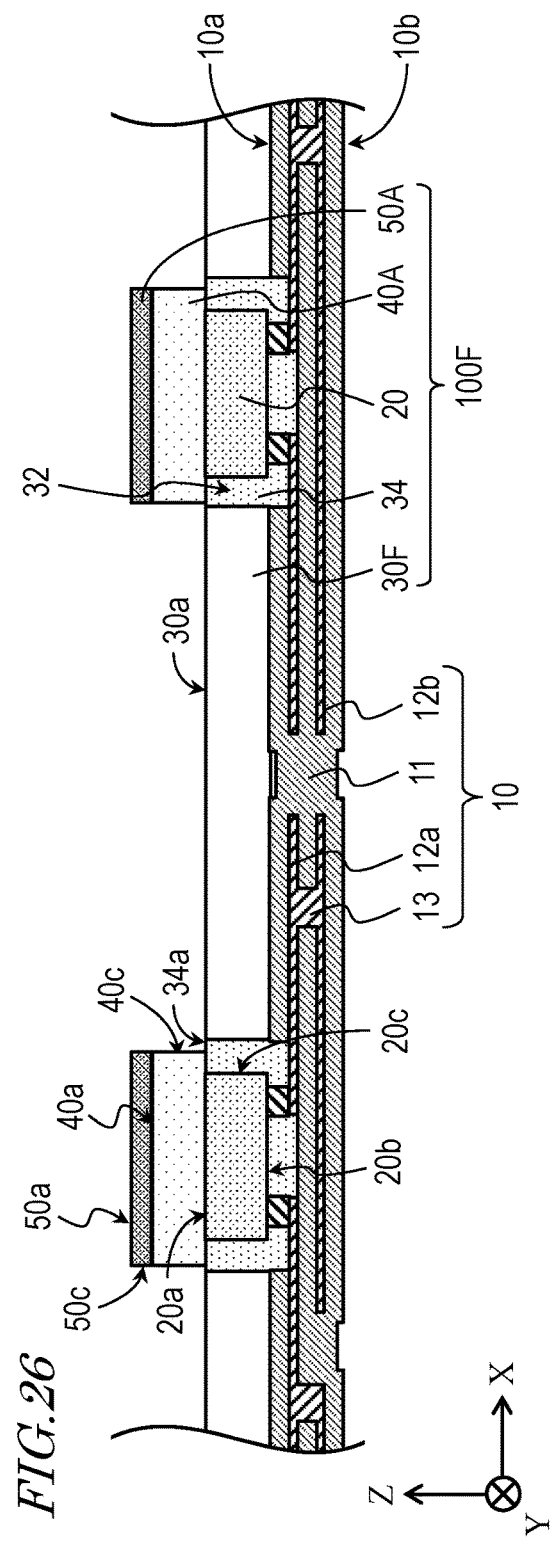

LIGHT-EMITTING DEVICE AND PLANAR LIGHT SOURCE

CROSS REFERENCE TO RELATED APPLICATION

This application claims priority to Japanese Patent Application No. 2020-146125, filed on Aug. 31, 2020, the disclosure of which is hereby incorporated by reference in its entirety.

BACKGROUND

The present disclosure relates to light-emitting devices and planar light sources.

Japanese Patent Publication No. 2015-106641 describes a light-emitting device in which lateral surfaces of a plurality of light-emitting elements on a substrate are covered by a light-reflecting member. The covering of the lateral surfaces of the light-emitting elements by the light-reflecting member can reduce leakage of light from the lateral surfaces of the light-emitting elements, resulting in enhancement of emission luminance. In the light-emitting device of Japanese Patent Publication No. 2015-106641, a layered structure including a light-transmitting layer and a wavelength conversion layer is disposed on the upper surfaces of the plurality of light-emitting elements and the light-reflecting member to cover all the upper surfaces of the light-emitting elements.

SUMMARY

As a direct-lit backlight for display devices such as a liquid crystal display device, a light-emitting device including a two-dimensional array of light-emitting elements has been proposed. For such a light-emitting device, there is a demand for a further improvement in light extraction efficiency.

A light-emitting device according to a non-limiting exemplary embodiment of the present disclosure includes: a wiring board comprising an interconnect layer; a plurality of light-emitting elements disposed on the wiring board and electrically coupled to the interconnect layer of the wiring board; a light-reflecting member disposed on the wiring board and covering a lateral surface of each of the plurality of light-emitting elements; a plurality of light-transmitting layers each located above an emission surface of a corresponding one of the plurality of light-emitting elements; a plurality of light-reflecting layers disposed on the plurality of light-transmitting layers; a light-diffusing layer disposed above the plurality of light-reflecting layers and the light-reflecting member; and a low-refractive-index layer located between the light-reflecting member and the light-diffusing layer and around each pair of one of the plurality of light-transmitting layers and one of the plurality of light-reflecting layers, the low-refractive-index layer having a refractive index lower than that of the plurality of light-transmitting layers. Each of the plurality of light-reflecting layers has a width in a cross-sectional view thereof which is equal to or greater than that of a corresponding one of the plurality of light-transmitting layers.

According to an exemplary embodiment of the present disclosure, luminance non-uniformity of light emitted from a light source can be reduced, and light extraction efficiency can be improved.

BRIEF DESCRIPTION OF THE DRAWINGS

FIG. 20 is a cross-sectional view for describing a step in an exemplary method of producing a light-emitting device according to an embodiment of the present disclosure.

FIG. 21 is a cross-sectional view for describing a step in an exemplary method of producing a light-emitting device according to an embodiment of the present disclosure.

FIG. 23 is a cross-sectional view for describing a step in an exemplary method of producing the light-emitting device of FIG. 10.

FIG. 24 is a cross-sectional view for describing a step in an exemplary method of producing the light-emitting device of FIG. 17.

FIG. 25 is a cross-sectional view for describing a step in an exemplary method of producing the light-emitting device of FIG. 17.

FIG. 26 is a cross-sectional view for describing a step in an exemplary method of producing the light-emitting device of FIG. 17.

DETAILED DESCRIPTION

Figure 1:
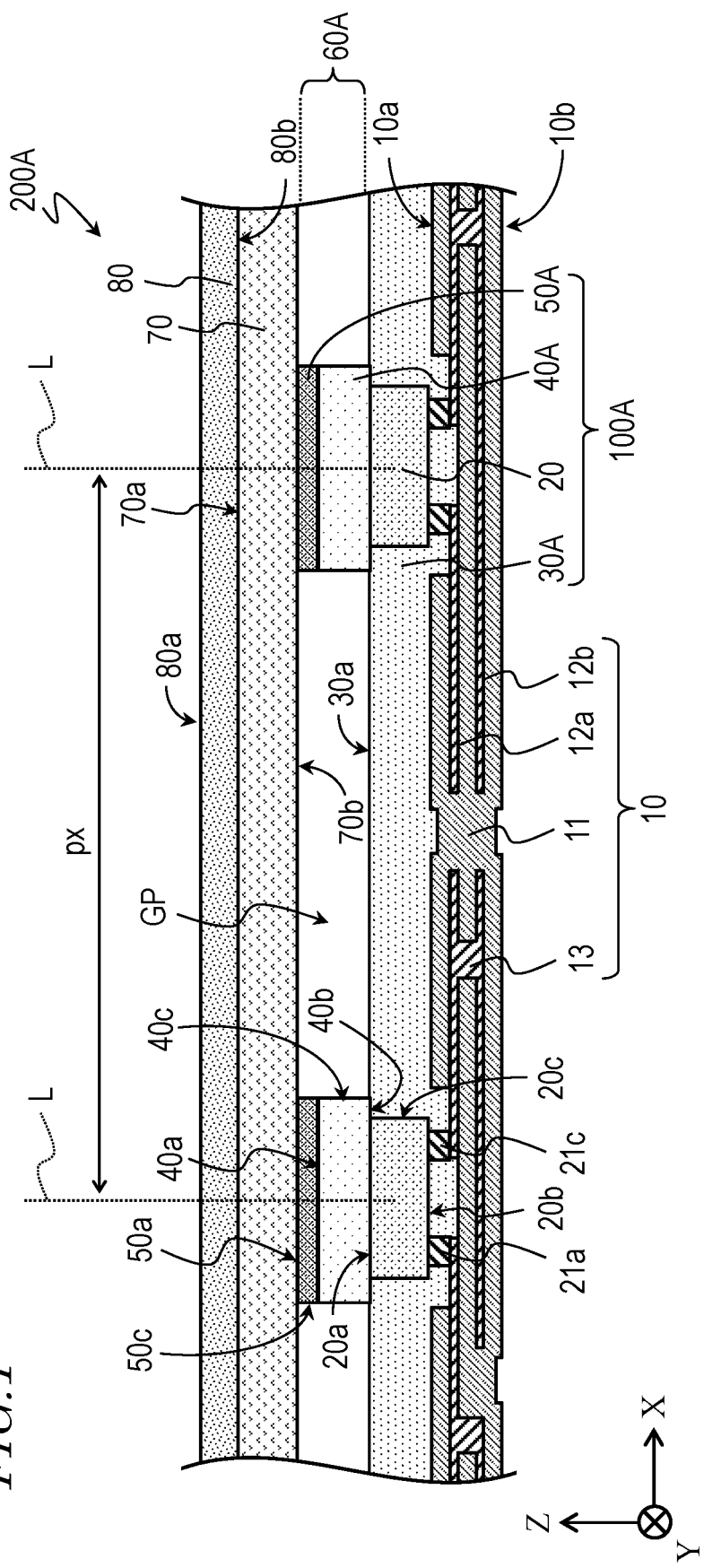
FIG. 1 is a schematic cross-sectional view showing an exemplary structure of a light-emitting device according to an embodiment of the present disclosure.

Embodiments of the present disclosure will now be described in detail with reference to the accompanying drawings. The following embodiments are illustrative, and a light-emitting device and planar light source according to the present disclosure are not limited thereto. For example, numerical values, shapes, materials, steps, and the order of the steps, etc., indicated in the following embodiments are merely illustrative, and various modifications can be made thereto unless a technical contradiction occurs. The embodiments below are merely illustrative and can be used in various combinations unless a technical contradiction occurs.

The dimensions, shapes, etc., of elements shown in the drawings may be exaggerated for clarity. The dimensions, shapes, etc., of an actual light-emitting device and planar light source are not necessarily drawn to scale, e.g., the dimensions of some parts relative to the other parts may be exaggerated. Some of the parts may not be shown, in order to avoid unnecessarily obscuring the drawings.

In the description that follows, parts having like functions may be denoted by like reference signs and may not be described redundantly. Terms indicating specific directions and positions (e.g., "upper," "lower," "right," "left," and other terms including such terms) may be hereinafter used. Note however that these terms are only used for clarity of illustration to refer to relative directions and positions in the drawings to which reference is made. When applied to drawings, actual products, actual manufacturing apparatuses, etc., other than those of the present disclosure, the parts may not have the same arrangement as that shown in the drawings to which reference is made, if the parts have the same directions and positions relative to each other that are indicated by the terms such as "upper" and "lower" in the drawings to which reference is made. As used herein, the term "parallel" with respect to two straight lines, sides, planes, etc., is intended to encompass some deviations from absolute parallelism (0°) that are in the range of about ±5° unless otherwise specified. As used herein, the term "perpendicular" or "orthogonal" with respect to two straight lines, sides, planes, etc., is intended to encompass some deviations from absolute perpendicularity or orthogonality (90°) that are in the range of about ±5° unless otherwise specified.

1. Structure of Light-Emitting Device 200A

FIG. 1 schematically shows an exemplary structure of a light-emitting device according to an embodiment of the present disclosure. For reference, in FIG. 1, X, Y, and Z directions which are orthogonal to each other are shown. These directions are also shown in some other figures of the present disclosure.

The light-emitting device 200A of FIG. 1 has a wiring board 10, and a light source section 100A mounted on the wiring board 10. The light source section 100A has a plurality of light-emitting elements 20, a light-reflecting member 30A that covers a lateral surface of each light-emitting element 20, a plurality of light-transmitting layers 40A, and a plurality of light-reflecting layers 50A. As schematically shown in FIG. 1, the structure in which the light-transmitting layer 40A and the light-reflecting layer 50A are put on top of each other is located above each light-emitting element 20.

In the configuration illustrated in FIG. 1, the light-emitting device 200A further has a light-diffusing layer 70, a low-refractive-index layer 60A located between the light-reflecting member 30A and the light-diffusing layer 70, and a wavelength conversion layer 80 disposed on the light-diffusing layer 70. In this example, the light-emitting device 200A has a space GP defined between an upper surface 30a of the light-reflecting member 30A and a lower surface 70b of the light-diffusing layer 70. Specifically, in the example of FIG. 1, the low-refractive-index layer 60A is an air layer. The light-emitting device 200A has an overall thickness (height in the Z direction) of, for example, about 0.60 mm.

Figure 2:
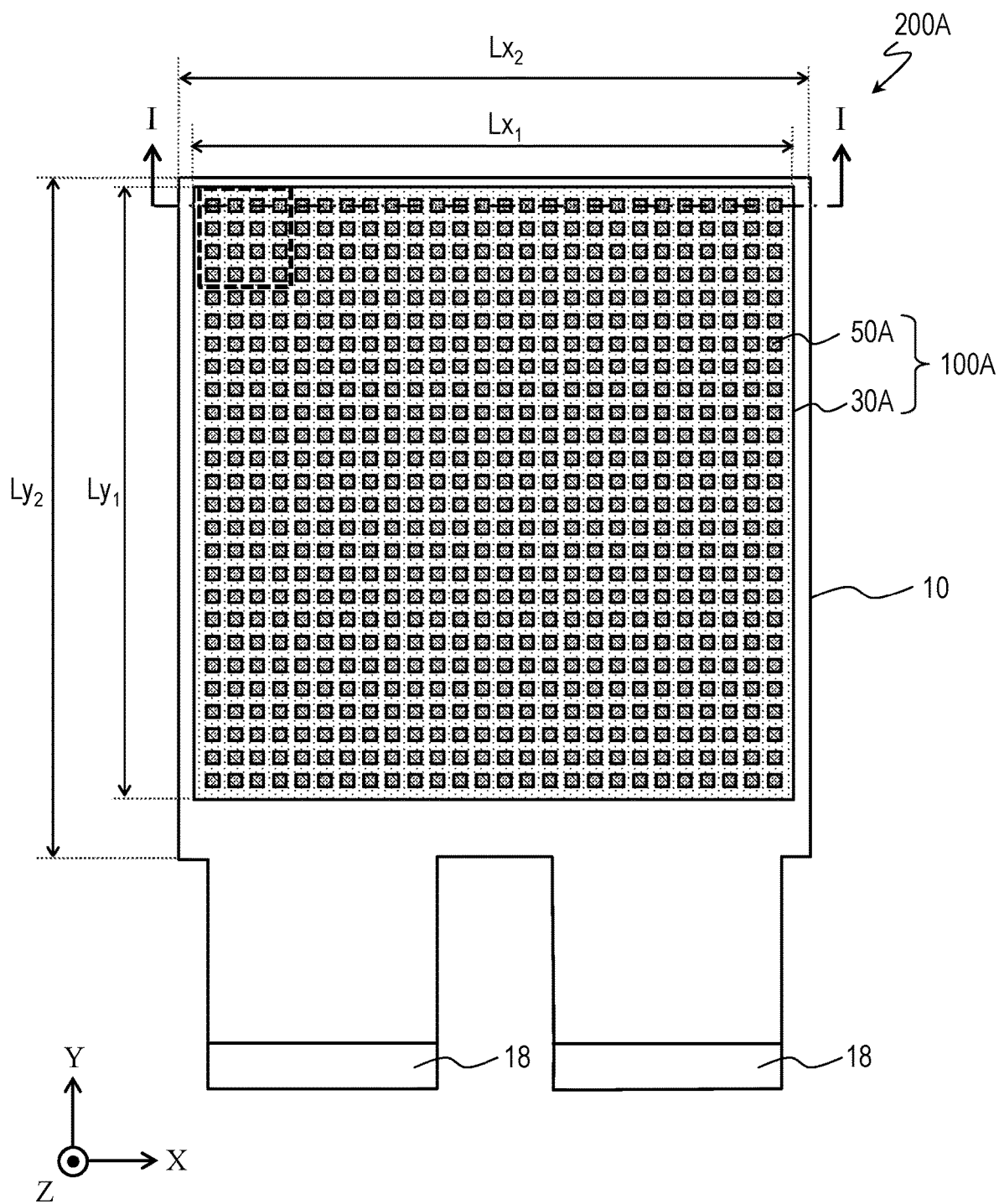
FIG. 2 is a schematic top view showing an exemplary appearance of a light source section and a wiring board shown in FIG. 1.

The plurality of light-emitting elements 20 may be arranged in a one- or two-dimensional array on an upper surface 10a of the wiring board 10. FIG. 2 schematically shows an example appearance of the structure of the light-emitting device 200A of FIG. 1 from which the light-diffusing layer 70 and the wavelength conversion layer 80 are removed. FIG. 2 can be said to show the wiring board 10, and the light source section 100A on the wiring board 10, in the structure of FIG. 1. The schematic cross-section of FIG. 1 corresponds to a portion of a cross-section taken along line I-I of FIG. 2.

In the example of FIG. 2, the plurality of light-reflecting layers 50A are arranged in a two-dimensional array extending in two directions orthogonal to each other (here, the X and Y directions). More specifically, a total of 676 light-reflecting layers 50A are arranged in an array of 26 rows and 26 columns. Here, as can be seen from FIG. 1, each light-emitting element 20 of the light source section 100A is located directly below a corresponding one of the light-reflecting layers 50A. Specifically, in the example of FIG. 2, the plurality of light-emitting elements 20 are arranged in a two-dimensional array on the wiring board 10.

In the example of FIG. 2, 26 light-emitting elements 20 are arranged in the X direction, and 26 light-emitting elements 20 are arranged in the Y direction. In this example, an array pitch px at which the light-emitting elements 20 are arranged in the X direction is equal to an array pitch py at which the light-emitting elements 20 are arranged in the Y direction. Here, the array pitch at which light-emitting elements are arranged means a distance between optical axes L of two adjacent light-emitting elements. As schematically shown in FIG. 1, the optical axis L is perpendicular to an emission surface (upper surface) of a light-emitting element. The array pitches px and py may each be set to 0.5 mm or greater and 10 mm or less. In an embodiment of the present disclosure, the array pitches px and py may each be about 2.0 mm.

In the example of FIG. 2, the light source section 100A includes 676 regions each having a light-emitting element 20. In the description that follows, for sake of simplicity, a unit having a light-emitting element is also referred to as a "segment" or "individual region." Each component of the light source section 100A will be described in detail below.

Wiring Board 10

The wiring board 10 has an upper surface 10a and a lower surface 10b. The plurality of light-emitting elements 20 are disposed and supported on the upper surface 10a of the wiring board 10. The wiring board 10 has a plurality of interconnect layers each having a wiring pattern, and an insulating section 11. In this embodiment, the wiring board 10 includes a first interconnect layer 12a and a second interconnect layer 12b. The first interconnect layer 12a and the second interconnect layer 12b are electrically coupled to each other through vias 13 provided in the insulating section 11. A portion of the insulating section 11 covers a region of the upper surface 10a of the wiring board 10 other than the regions of the upper surface 10a where the light-emitting elements 20 are mounted.

Examples of a material for the insulating section 11 of the wiring board 10 include resin materials such as phenolic resins, epoxy resins, polyimide resins, BT resins, polyphthalamides (PPAs), and polyethylene terephthalate (PET). As the material for the insulating section 11 of the wiring board 10, composite materials such as glass fiber-reinforced resins (glass epoxy resins), or ceramics, may be used.

In the configuration of FIG. 1, the first interconnect layer 12a is provided on the side of the upper surface 10a of the wiring board 10. Each light-emitting element 20 has a positive electrode (anode) 21a and a negative electrode (cathode) 21c which are electrically coupled to the first interconnect layer 12a. Meanwhile, the second interconnect layer 12b is provided on the lower surface 10b of the wiring board 10. As described below, the second interconnect layer 12b is coupled to a connector 18 (see FIG. 2) for coupling to an external control circuit.

A material for the interconnect layers (here, the first interconnect layer 12a and the second interconnect layer 12b) is suitably selected, depending on a material, production method, etc., for the insulating section 11 of the wiring board 10. An insulating film such as a solder resist may be provided on the interconnect layers.

As illustrated in FIG. 2, the light source section 100A located on the wiring board 10 typically has a rectangular shape in a top plan view. In the configuration of FIG. 2, a length $Lx_1$ in the X direction and a length $Ly_1$ in the Y direction of the light source section 100A are, for example, about 52 mm. A length $Lx_2$ in the X direction and a length Lye in the Y direction of the region of the wiring board 10 where the light source section 100A is provided are, for example, about 55 mm and about 60 mm, respectively. The wiring board 10 may have a thickness (height in the Z direction in the figures) of about 0.17 mm.

Figure 3:
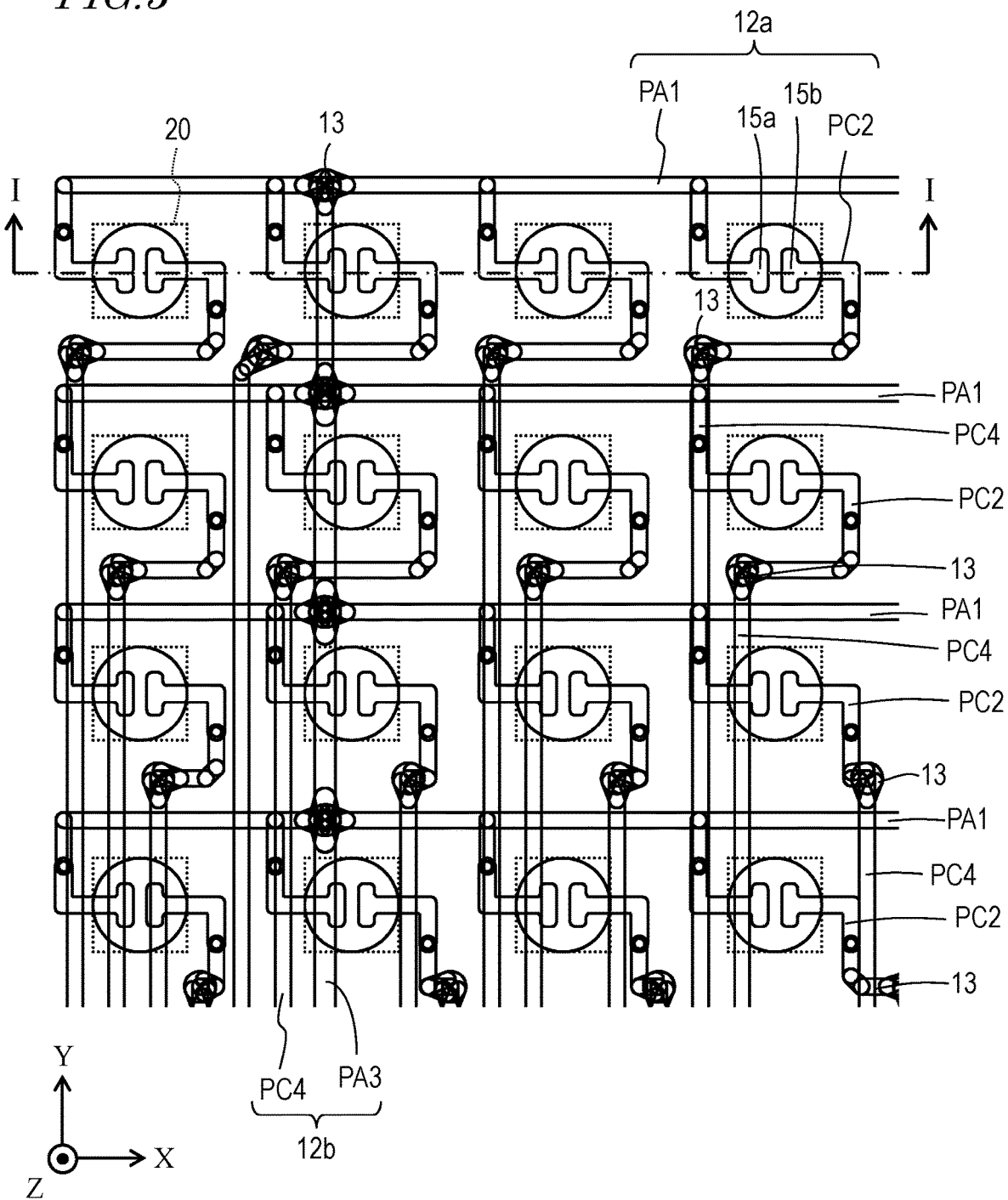
FIG. 3 is a schematic diagram showing a wiring pattern in a region including 4×4 segments surrounded by a dashed-line rectangle shown in FIG. 2.

FIG. 3 schematically shows a region of the interconnect layer that is surrounded by a dashed-line rectangle in FIG. 2 and includes 4×4 segments (also hereinafter simply referred to as a "segment region"). The 676 light-emitting elements 20 arranged in a two-dimensional array are electrically coupled to the first interconnect layer 12a. As schematically shown in FIG. 3, the first interconnect layer 12a includes a plurality of first interconnects PA1 each extending in the X direction, and a plurality of sets of an anode-side land 15a and a cathode-side land 15b. In the first interconnect layer 12a, the positive and negative electrodes 21a and 21c of the light-emitting element 20 in each segment are coupled to the lands 15a and 15b, respectively. Here, the plurality of first interconnects PA1 are disposed in the column direction (the Y direction) of the array of 4 rows and 4 columns of the segment. The first interconnect PA1 on each row are coupled to the plurality of lands 15a located on the same row. Specifically, each first interconnect PA1 electrically couples together the positive electrodes 21a of the plurality of light-emitting elements 20 located on the same row.

The first interconnect layer 12a also has a plurality of second interconnects PC2. As shown in FIG. 3, the plurality of second interconnects PC2 are provided for each segment, and each second interconnect PC2 is coupled to a corresponding one of the cathode-side lands 15b.

The first and second interconnects PA1 and PC2 of the first interconnect layer 12a are coupled to the second interconnect layer 12b through vias 13. The second interconnect layer 12b includes a third interconnect PA3 extending in the Y direction, and a fourth interconnect PC4 provided for each segment.

Figure 4:
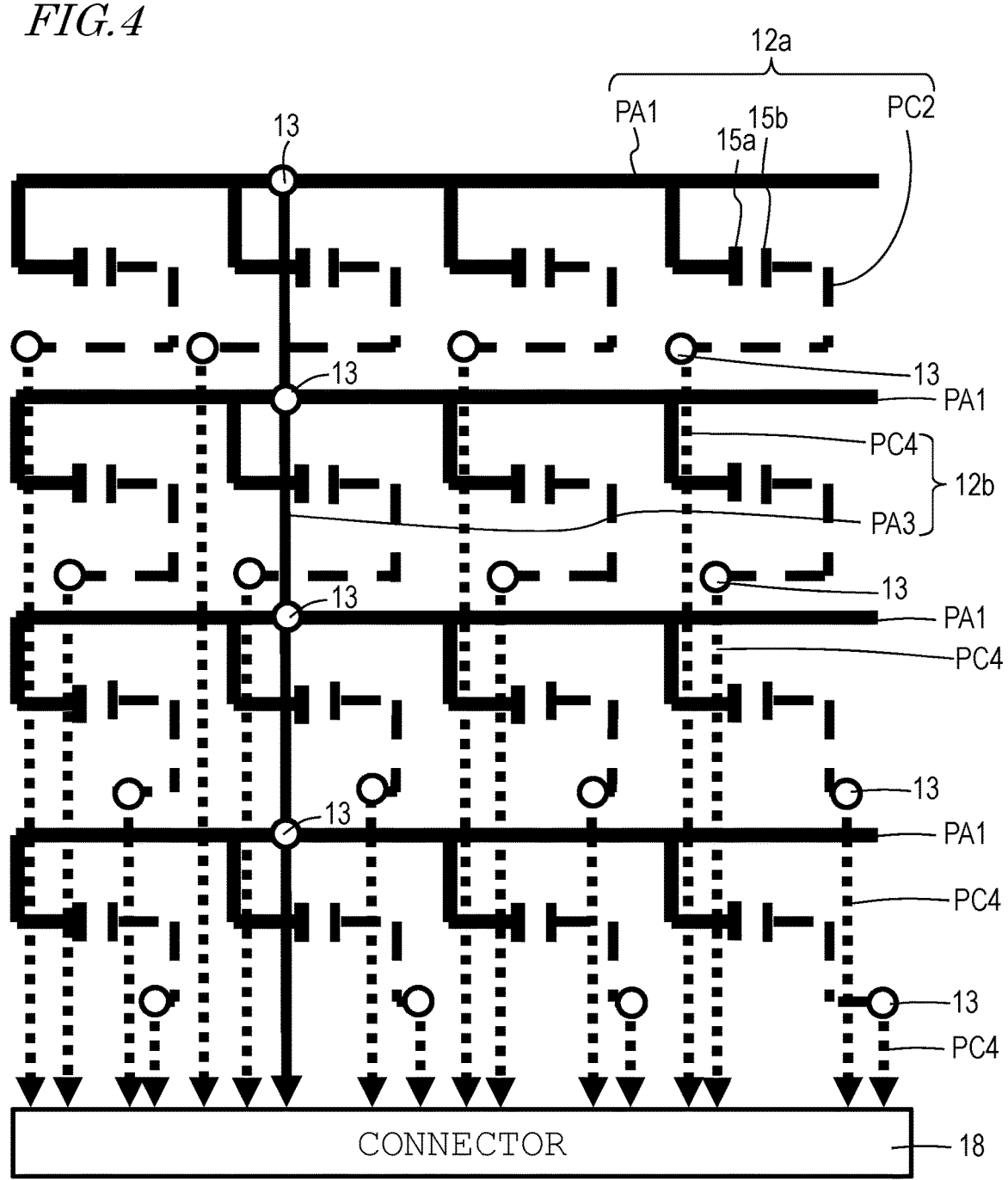
FIG. 4 is a diagram of a wiring pattern in a segment region shown in FIG. 3.

FIG. 4 shows an example coupling relationship between the interconnect layers in the segment region and the connector. As schematically shown in FIG. 4, the plurality of first interconnects PA1 of the first interconnect layer 12a are coupled to the common third interconnect PA3 through vias 13. The third interconnect PA3 is coupled to the connector 18. Thus, this coupling relationship allows supply of a common voltage drive signal from the third interconnect PA3 to all the positive electrodes 21a of the light-emitting elements 20.

Meanwhile, the second interconnect PC2 of the first interconnect layer 12a provided for each segment is electrically coupled to a corresponding one of the plurality of fourth interconnects PC4 through a via 13. As shown in FIG. 4, each fourth interconnect PC4 is coupled to the connector 18. This coupling relationship allows supply of a voltage drive signal to the negative electrode 21c of the light-emitting element 20 through the fourth interconnect PC4 on a segment-by-segment basis.

Such an electrical coupling relationship allows supply of power from an external control circuit (not shown) to the plurality of light-emitting elements 20 through the connector 18 of the wiring board 10. The wiring pattern of anodes and cathodes described above with reference to FIGS. 3 and 4 allows the light-emitting element to be matrix-driven on a segment-by-segment basis. In other words, here, the light source section 100A is configured to be capable of performing local dimming operation.

Light-Emitting Element 20

A typical example of the light-emitting element 20 is a semiconductor light-emitting element. As the light-emitting element 20, a known light-emitting element such as a semiconductor laser or a light-emitting diode can be used. As the wavelength of light emitted from the light-emitting element 20, any suitable wavelength can be selected. For example, as a light-emitting element that emits light in an ultraviolet-visible wavelength region, a semiconductor light-emitting element employing a nitride semiconductor ($In_xAl_yGa_{1-x-y}N$, $0 \leq X$, $0 \leq Y$, $X+Y \leq 1$) can be used. In addition, as a light-emitting element that emits light in a red wavelength region, a semiconductor light-emitting element containing a semiconductor such as GaAlAs or AlInGaP can be used. Furthermore, a semiconductor light-emitting element formed of a material other than those described above can be used as the light-emitting element 20. The composition of the semiconductor used, and the color of light, size, number, etc., of light-emitting elements, can be suitably selected, depending on the purpose and design specifications.

The semiconductor multilayer structure in the semiconductor light-emitting element can include at least one light-emitting layer that can emit light in the ultraviolet-visible region as described above. For example, the semiconductor multilayer structure can include a light-emitting layer that can emit light having one color or wavelength, between an n-type semiconductor layer and a p-type semiconductor layer. Note that the light-emitting layer may have a structure including a single active layer such as a double-heterojunction or single-quantum well structure (SQW), or a structure including a group of active layers such as a multiple-quantum well structure (MQW).

The semiconductor multilayer structure can include a plurality of light-emitting layers. For example, semiconductor multilayer structure may have a structure including a plurality of light-emitting layers between an n-type semiconductor layer and a p-type semiconductor layer, or a structure including a plurality of repeating structures including a sequence of an n-type semiconductor layer, a light-emitting layer, and a p-type semiconductor layer. The plurality of light-emitting layers may include active layers that emit light beams having different colors or wavelengths, or active layers that emit light beams having the same color or wavelength. Note that the same color with respect to light beams may encompass a range in which the light beams are perceived as having the same color, e.g., some deviations from a main wavelength that are in the range of several nanometers. A suitable combination of colors or wavelengths of emitted light beams can be selected. For example, in the case in which the semiconductor multilayer structure includes two active layers, examples of a combination of colors of emitted light beams include blue and blue, green and green, red and red, ultraviolet and ultraviolet, blue and green, blue and red, and green and red.

The negative electrode 21c and the positive electrode 21a are electrically coupled to the n-type semiconductor layer and the p-type semiconductor layer, respectively. The light-emitting element 20 has an upper surface 20a, a lower surface 20b located opposite to the upper surface 20a, and a lateral surface 20c located between the upper surface 20a and the lower surface 20b. As described below, in this embodiment, the lateral surface 20c of each light-emitting element 20 is covered by the light-reflecting member 30A. Thus, in the light source section 100A, light of the light-emitting element 20 is extracted mainly from the upper surface 20a. As used herein, the emission surface with respect to the light-emitting element 20 generally means the upper surface 20a of the light-emitting element 20.

In this embodiment, the positive electrode 21a and the negative electrode 21c are both located on the lower surface 20b. The positive electrode 21a and the negative electrode 21c of the light-emitting element 20 are electrically coupled and fixed to the first interconnect layer 12a provided on the upper surface 10a of the wiring board 10. The light-emitting element 20 may be mounted in the form of the light source section 100A on the wiring board 10, or in the state of the light-emitting element 20 on the wiring board 10.

The light-emitting element 20 is typically a bare chip. A height in the Z direction from the upper surface 10a of the wiring board 10 to the upper surface 20a of the light-emitting element 20 may, for example, be about 0.425 mm.

As described above, in this embodiment, the plurality of light-emitting elements 20 are arranged in a two-dimensional array extending in the X and Y directions, and the array pitch px in the X direction is equal to the array pitch py in the Y direction. However, the arrangement of the plurality of light-emitting elements 20 is not limited to this. The array pitches in the X and Y directions of the light-emitting elements 20 may be different, and the two directions of the two-dimensional array of the plurality of light-emitting elements 20 may not be orthogonal. In addition, for the array pitch, the plurality of light-emitting elements 20 may or may not be equally spaced. For example, the plurality of light-emitting elements 20 may be arranged such that the space between adjacent light-emitting elements 20 becomes wider from the center toward the periphery of the wiring board 10.

The plurality of light-emitting elements 20 may include two or more types of light-emitting elements 20. The plurality of light-emitting elements 20 may, for example, include a light-emitting element that emits light having a blue wavelength, a light-emitting element that emits light having a green wavelength, and a light-emitting element that emits light having a red wavelength. The types of light-emitting elements used in the light-emitting device 200A may be determined in view of an improvement in the color reproducibility of light emitted from the light-emitting device 200A.

Light-Reflecting Member 30A

The light-reflecting member 30A is a portion of the light source section 100A, and is located on the wiring board 10. The light-reflecting member 30A covers the upper surface 10a of the wiring board 10 and the lateral surface 20c of each light-emitting element 20. The light-reflecting member 30A may include a portion located between the lower surface 20b of the light-emitting element 20 and the upper surface 10a of the wiring board 10. For example, the light-reflecting member 30A may be formed to fill a space between the lower surface 20b of the light-emitting element 20 and the upper surface 10a of the wiring board 10, thereby covering the positive electrode 21a and the negative electrode 21c of the light-emitting element 20. Note that instead of the light-reflecting member 30A, a light reflective resin may be provided to fill the space between the lower surface 20b of the light-emitting element 20 and the upper surface 10a of the wiring board 10. The light reflective resin provided between the lower surface 20b of the light-emitting element 20 and the upper surface 10a of the wiring board 10 may reduce stress that may occur due to the difference in coefficient of thermal expansion between the light-emitting element 20 and the wiring board 10, and allows an improvement in heat dissipation properties, and the like.

The light-reflecting member 30A is formed of, for example, a material containing a resin and particles of a reflective material dispersed in the resin. As a base material for the light-reflecting member 30A, a photocurable resin containing an acrylate resin, epoxy resin, or the like as a primary component can be used. As described below, as the light-reflecting member 30A, a light reflective resin sheet whose base material is polyethylene terephthalate (PET) or the like may be used. Examples of the particles of a reflective material include particles of an oxide such as titanium oxide, aluminum oxide, silicon oxide, or zinc oxide. The oxide particles have an average particle size of, for example, about 0.05 µm or greater and about 30 µm or less. The light-reflecting member 30A may further contain a pigment, light absorption material, phosphor, or the like. The particles of a reflective material, which scatter light, may be uniformly distributed in the light-reflecting member 30A.

The light-reflecting member 30A has the function of protecting the plurality of light-emitting elements 20. In particular, the light-reflecting member 30A has the function of reflecting light emitted from the lateral surface 20c of the light-emitting element 20, thereby allowing the light source section 100A to emit light mainly from the upper surface 20a of the light-emitting element 20. As a result, light can be efficiently introduced into the light-transmitting layer 40A described below, so that the light can be effectively diffused in an in-plane fashion in the light-emitting device 200A by means of reflection by the light-reflecting layer 50A. In addition, the light-reflecting member 30A, which has light reflectivity, can reflect light coming from the light-diffusing layer 70 at the upper surface 30a thereof. As a result, by effectively utilizing light emitted from the light-transmitting layer 40A, luminance can be enhanced at the emission surface (here, an upper surface 80a of the wavelength conversion layer 80) of the light-emitting device 200A. As used herein, the term "light reflectivity" and "light reflective" refers to a reflectance of 60% or greater with respect to the peak wavelength of light emitted from the light-emitting element 20. The reflectance of the light-reflecting member 30A with respect to the peak wavelength of light emitted from the light-emitting element 20 is more preferably 70% or greater, even more preferably 80% or greater.

The upper surface 30a of the light-reflecting member 30A is, for example, a flat surface as shown in FIG. 1. Note that it is not essential in embodiments of the present disclosure that the upper surface 30a of the light-reflecting member is a flat surface. As described below, the upper surface 30a may have one or more recessed surfaces. The upper surface 30a may also have one or more protrusions.

A portion of the light-reflecting member 30A is also disposed on the lower surface 20b of the light-emitting element 20, whereby light traveling toward the upper surface 10a of the wiring board 10 can be reflected by the light-reflecting member 30A to be guided toward above the light-emitting element 20. As a result, the light efficiency of the light-emitting element 20 can be further improved.

Light-Transmitting Layer 40A

Each light-transmitting layer 40A is located above the upper surface 20a of a corresponding one of the plurality of light-emitting elements 20. Note that the light-transmitting layer 40A may be disposed above the upper surface 20a of the light-emitting element 20 with a light transmitting adhesive layer interposed therebetween. Therefore, an adhesive layer may be provided between the light-transmitting layer 40A and the light-emitting element 20.

As a material for the light-transmitting layer 40A, for example, a resin material such as an acrylic resin, epoxy resin, silicone resin, or a mixture thereof can be used. As used herein, the term "light transmission" and "light transmitting" are construed in its broader sense as being capable of diffusing incident light, and is not limited to "transparent." For example, in the light-transmitting layer 40A, a material having a refractive index different from that of the base material may be dispersed, whereby the light-transmitting layer 40A has a light diffusion function. The light diffusion function may be imparted to the light-transmitting layer 40A by dispersing, in the base material, a light diffusion material (e.g., particles of titanium oxide, aluminum oxide, silicon oxide, zinc oxide, or the like).

As shown in FIG. 1, the light-transmitting layer 40A has an upper surface 40a, a lower surface 40b located opposite to the upper surface 40a, and a lateral surface 40c located between the upper surface 40a and the lower surface 40b. The light-transmitting layer 40A typically has a thickness in the range of 50 μm or greater and 300 μm or less.

Figure 5:
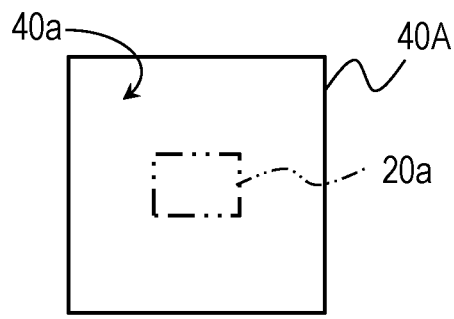
FIG. 5 is a schematic top view showing an exemplary relationship between a size of an upper surface of a light-emitting element and a shape of a light-transmitting layer.
Figure 6:
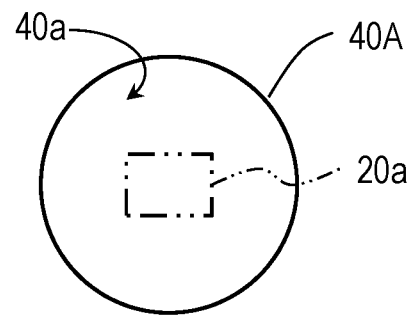
FIG. 6 is a schematic top view showing another exemplary relationship between a size of an upper surface of a light-emitting element and a shape of a light-transmitting layer.

The light-transmitting layer 40A typically has a rectangular shape in a top plan view as shown in FIG. 5. The shape of the light-transmitting layer 40A in a top plan view is not limited to a rectangle, and may be such that the light-transmitting layer 40A can cover the entire upper surface 20a of the light-emitting element 20 in a top plan view, i.e., other shapes, such as a circle as shown in FIG. 6. As shown in FIG. 1, a width of the light-transmitting layer 40A in a cross-section view thereof is typically greater than that of the light-emitting element 20 located directly below the light-transmitting layer 40A. Each light-transmitting layer 40A may encloses, within an outer periphery thereof, the emission surface of the corresponding one light-emitting element 20 in a top plan view. In other words, the emission surface of each light-emitting element 20 may be located within a corresponding one of the light-transmitting layers 40A in a top plan view.

As schematically shown in FIGS. 5 and 6, each light-transmitting layer 40A provided in the light source section 100A may have such a size that the light-transmitting layer 40A includes the emission surface (here, the upper surface 20a) of a corresponding one of the light-emitting elements 20 in a top plan view. For example, the lower surface 40b of the light-transmitting layer 40A may have an area that is 100% or greater and 300% or less of the upper surface 20a of the light-emitting element 20. For example, in the case in which the upper surface 40a of the light-transmitting layer 40A has a square shape, the length of a side thereof may be about 0.5 mm. The center of the light-transmitting layer 40A is preferably located on the optical axis L of a corresponding one of the light-emitting elements 20.

Because the light-transmitting layer 40A has an area that is equal to or greater than that of the upper surface 20a of the light-emitting element 20 in a top plan view, a greater amount of light is more likely to reach locations away from the light-emitting element 20 in a top plan view. As a result, a significant difference in luminance between the region directly above each light-emitting element 20, where luminance is more likely to be relatively high, and a region between two adjacent light-emitting elements 20, can be avoided, whereby a decrease in luminance can be reduced, and luminance non-uniformity can be reduced at the emission surface of the light-emitting device 200A.

Figure 7:
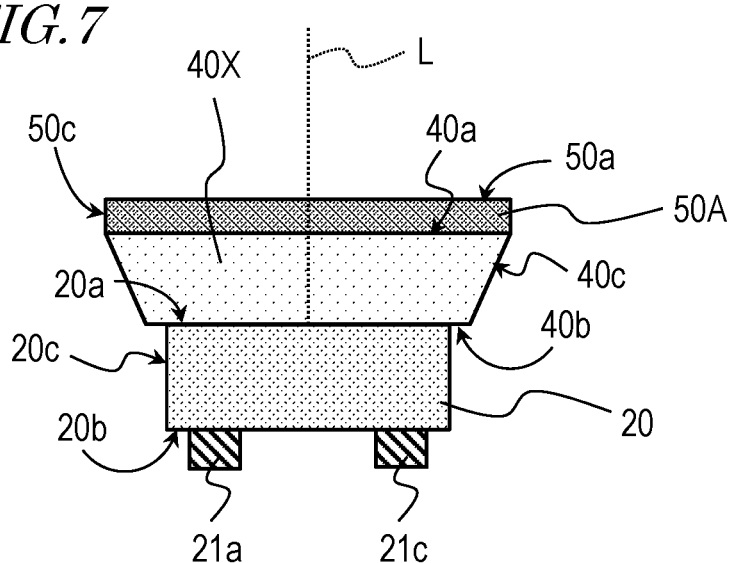
FIG. 7 is a schematic cross-sectional view showing another exemplary shape of a light-transmitting layer located above a light-emitting element.

FIG. 7 shows another example shape of the light-transmitting layer located above the light-emitting element. For the sake of simplicity, FIG. 7 schematically shows cross-sections of the light-emitting element, the light-transmitting layer, and the light-reflecting layer removed from the light source section of the light-emitting device.

In the example of FIG. 7, the lateral surface 40c of the light-transmitting layer 40X is tilted with respect to a plane perpendicular to the lower surface 40b. In this example, the upper surface 40a of the light-transmitting layer 40X has an area greater than that of the lower surface 40b. In other words, here, the light-transmitting layer 40X is in the shape of an inverted frustum (typically, an inverted quadrangular frustum), so that the lateral surface 40c thereof is tilted in a cross-sectional view such that the distance between the lateral surface 40c and the optical axis L of the light-emitting element 20 increases as one moves on the lateral surface 40c from the lower surface 40b toward the upper surface 40a.

The shape in a cross-sectional view of the lateral surface 40c of the light-transmitting layer is not limited to the above example, and may be a straight line parallel to the optical axis L of the light-emitting element 20. In addition, the shape in a cross-sectional view of the lateral surface 40c is not limited to a straight line as shown in FIGS. 1 and 7, and may partially include a curve, bend, step, or the like. Note that the same applies to the shape in a cross-sectional view of a lateral surface 50c described below of the light-reflecting layer 50A. The shape in a cross-sectional view of the lateral surface 50c of the light-reflecting layer 50A is not limited to a straight line parallel to the optical axis L of the light-emitting element 20, and may be tilted with respect to the optical axis L of the light-emitting element 20.

In the example of FIG. 7, the lower surface 40*b* of the light-transmitting layer 40X has an area greater than that of the upper surface 20*a* of the light-emitting element 20. In other words, the lower surface 40*b* of the light-transmitting layer 40X has, in a cross-sectional view, a width greater than that of the light-emitting element 20. However, the shape of the light-transmitting layer 40X is not limited to this example, and the lower surface 40*b* of the light-transmitting layer 40X may have substantially the same area as that of the upper surface 20*a* of the light-emitting element 20.

Light-Reflecting Layer 50A

As shown in FIG. 1, the plurality of light-reflecting layers 50A are disposed on the plurality of light-transmitting layers 40A. Here, each light-reflecting layer 50A is a semi-light-shielding layer that partially transmits and partially reflects incident light, and is provided on the upper surface 40*a* of a corresponding one of the light-transmitting layers 40A. Each light-reflecting layer 50A and the corresponding one of the light-transmitting layers 40A may constitute a pair.

As with the light-reflecting member 30A, the light-reflecting layer 50A may be formed of a material containing a resin and particles of a reflective material dispersed in the resin, the particles being formed of an oxide such as titanium oxide, aluminum oxide, or silicon oxide. As a base material for the light-reflecting layer 50A, a photocurable resin containing an acrylate resin, epoxy resin, or the like as a primary component can be used. The oxide particles have an average particle size of, for example, about 0.05 µm or greater and about 30 µm or less. The light-reflecting layer 50A may further contain a pigment, light absorption material, phosphor, or the like. The light-reflecting layer 50A has a thickness in the range of, for example, 50 µm or greater and 100 µm or less. In this embodiment, the light-reflecting layer 50A may have a thickness of, for example, about 50 µm.

Because the light-reflecting layer 50A is provided on the light-transmitting layer 40A located above the emission surface of the light-emitting element 20, light introduced from the light-emitting element 20 and traveling toward the upper surface 40*a* of the light-transmitting layer 40A can be reflected by the light-reflecting layer 50A. Thus, light emitted from the upper surface 50*a* of the light-reflecting layer 50A in a direction tilted at a small angle with respect to the optical axis L of the light-emitting element 20 is reduced. In addition, by utilizing the reflection by the light-reflecting layer 50A, light introduced from the light-emitting element 20 into the light-transmitting layer 40A can be effectively diffused inside the light-transmitting layer 40A. The light diffused inside the light-transmitting layer 40A is emitted out of the light-transmitting layer 40A mainly from the lateral surface 40*c* of the light-transmitting layer 40A. Thus, in the embodiment of the present disclosure, the light-transmitting layer 40A is optically coupled to the emission surface of the light-emitting element 20, and the light-reflecting layer 50A is disposed on the light-transmitting layer 40A, which allows light reflected by the light-reflecting layer 50A to effectively spread in a transverse direction in the light-emitting device 200A. Thus, the light-emitting device 200A can have a thin shape and reduced luminance non-uniformity at the emission surface thereof.

The light-reflecting layer 50A has such a shape and position that the light-reflecting layer 50A overlays the light-transmitting layer 40A in a top plan view, and therefore, the amount of light can be reduced in a region directly above the light-emitting element 20 of the emission surface of the light-emitting device 200A. In other words, the luminance of a region directly above the light-emitting element 20 of the emission surface of the light-emitting device 200A can be inhibited from being significantly higher than that of the other regions.

Each light-reflecting layer (e.g., each light-reflecting layer 50A) may enclose, within an outer periphery thereof, a corresponding one of the plurality of light-transmitting layers 40A in a top plan view. In other words, each light-transmitting layers 40A may be located within a corresponding one of the light-reflecting layer 50A in a top plan view. Here, embodiments in which the light-reflecting layer encloses the light-transmitting layer in a top plan view include an embodiment in which the light-reflecting layer continuously covers the entire upper surface 40*a* of the light-transmitting layer, and an embodiment in which the light-reflecting layer discontinuously covers the upper surface 40*a* of the light-transmitting layer. For example, each light-reflecting layer may be formed in a dotted light reflection pattern on the upper surface 40*a* of the light-transmitting layer. In that case, the upper surface 40*a* of the light-transmitting layer is partially exposed from the light-reflecting layer.

Figure 8:
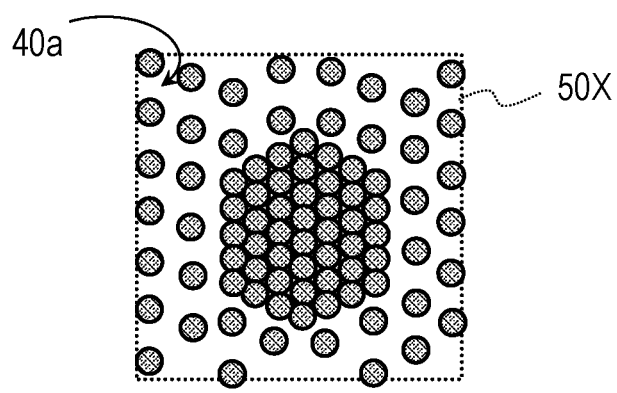
FIG. 8 is a schematic plan view showing an exemplary light reflection pattern on an upper surface of a light-transmitting layer.

FIG. 8 shows an example light reflection pattern on the upper surface 40*a* of the light-transmitting layer. The light-reflecting layer 50X of FIG. 8 has a dotted light reflection pattern. In this example, the light-reflecting layer 50X is a set of light-reflecting members each of which is in the shape of a dot. The dot density (e.g., a number density represented by the number of dots per unit area) of the light reflection pattern in the light-reflecting layer 50X becomes higher toward the center of the light-reflecting layer 50X from the outside thereof.

The dotted light reflection pattern may be said to be a pattern defined by a distribution of particles of a reflective material in each light-reflecting layer. The density of the particles of a reflective material is higher in a region in which the absolute value of the beam spread angle of the light-emitting element 20 is smaller (i.e., an angular range in which the angle of the tilt with respect to the optical axis L is smaller) than in a region in which the absolute value of the beam spread angle is greater. Thus, the light transmittance can be changed according to the absolute value of the beam spread angle, and the light reflectance or transmittance can be controlled by the dot density. As another example, by controlling the thickness of the light-reflecting layer, the light transmittance can be changed according to the absolute value of the beam spread angle. The thickness of the light-reflecting layer may be gradually increased as the absolute value of the beam spread angle of the light-emitting element 20 decreases, i.e., as one moves toward the optical axis L from the outside of the light-reflecting layer. Alternatively, a plurality of openings may be provided in the light-reflecting layer such that the aperture increases as one moves away from the optical axis L.

Figure 9:
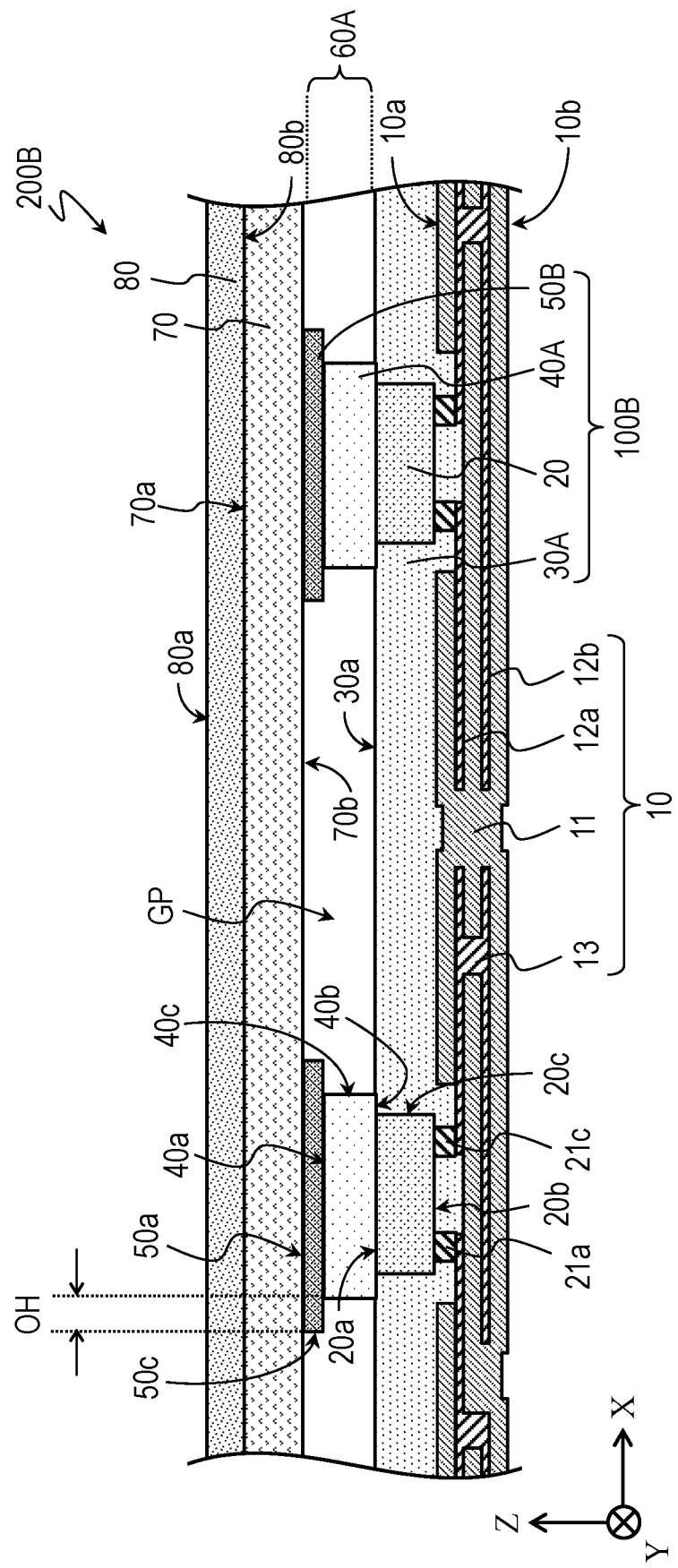
FIG. 9 is a schematic cross-sectional view showing an exemplary structure of a light-emitting device according to another embodiment of the present disclosure.

FIG. 9 schematically shows an exemplary structure of a light-emitting device according to another embodiment of the present disclosure. Compared to the light-emitting device 200A of FIG. 1, the light-emitting device 200B of FIG. 9 has a light source section 100B instead of the light source section 100A. The light source section 100B has a light-reflecting layer 50B on the light-transmitting layer 40A.

In the configuration illustrated in FIG. 9, the light-reflecting layer 50B has a width greater than that of the light-transmitting layer 40A. A distance OH (indicated by arrowheads in FIG. 9) between the lateral surface 40*c* of the light-transmitting layer 40A and a lateral surface 50c of the light-reflecting layer 50B may, for example, be about 50 μm.

For example, the light-reflecting layer 50B has an area greater than the upper surface 40a of the light-transmitting layer 40A in a top plan view. By disposing the light-reflecting layer 50B on the light-transmitting layer 40A, light particularly emitted from the lateral surface 40c of the light-transmitting layer 40A can be repeatedly reflected between the light-reflecting layer 50B and the light-reflecting member 30A. As a result, light emitted from the lateral surface 40c of the light-transmitting layer 40A is allowed to propagate further away from the light-emitting element 20. Because light reaches further away from the light-emitting element 20, the difference in luminance between the region directly above the light-transmitting layer 40A of the light-emitting device 200B and the surrounding region as viewed in the Z direction is reduced. Therefore, the effect of reducing luminance non-uniformity can be achieved, so that the region directly above the light-transmitting layer 40A can be substantially inhibited from appearing as a point light source.

Light-Diffusing Layer 70

As shown in FIGS. 1 and 9, the light-emitting devices according to the embodiments of the present disclosure have the plurality of light-reflecting layers (e.g., the light-reflecting layers 50A) and the light-diffusing layer 70 located above the light-reflecting member 30A. The lower surface 70b of the light-diffusing layer 70 may be in direct contact with at least a portion of the upper surfaces 50a of the plurality of light-reflecting layers, or the light-diffusing layer 70 may be spaced apart from the upper surfaces 50a of the plurality of light-reflecting layers, in the light-emitting device.

The light-diffusing layer 70 allows diffusion therein of light emitted out of the light-transmitting layer 40A from the lateral surface 40c of the light-transmitting layer 40A and introduced into the light-diffusing layer 70. In the configurations of FIGS. 1 and 9, the light-diffusing layer 70 is a sheet-shaped member that covers the upper surfaces 50a of the plurality of light-reflecting layers (e.g., the light-reflecting layers 50A). The light-diffusing layer 70 may be a single layer, or may have a multilayer structure including a plurality of sheets. The light-diffusing layer 70 may have a thickness of, for example, about 200 μm.

The light-diffusing layer 70 may be formed of a material that absorbs a small amount of visible light such as a polycarbonate resin, polystyrene resin, acrylic resin, polyethylene resin, or the like, as a base material. A structure that diffuses light can be imparted to the light-diffusing layer 70 by providing roughness on one or both of the upper surface 70a and the lower surface 70b thereof, or dispersing a material having a different refractive index in the light-diffusing layer 70. The light-diffusing layer 70 typically contains a light diffusion material. As the light diffusion material, particles of a high-refractive-index material such as silicon oxide, zirconium oxide, or titanium oxide (high-refractive-index fine particles) can be used. The surface of the light-diffusing layer 70 may be generally flat, or may have fine roughness.

As with the light-emitting device 200A of FIG. 1, the light-emitting device 200B of FIG. 9 has the low-refractive-index layer 60A between the upper surface 30a of the light-reflecting member 30A and the lower surface 70b of the light-diffusing layer 70. In this example, an air layer is also provided as the low-refractive-index layer 60A in the light-emitting device 200B. In other words, the light-emitting device 200B has a space GP between the upper surface 30a of the light-reflecting member 30A and the lower surface 70b of the light-diffusing layer 70.

The low-refractive-index layer 60A is provided between the light-reflecting member 30A and the light-diffusing layer 70, except for portions thereof occupied by a plurality of pairs of the light-transmitting layer 40A and the light-reflecting layer 50A. This allows the low-refractive-index layer 60A to function as a light guide layer. By disposing the low-refractive-index layer 60A thus configured in the light-emitting device, light emitted from the lateral surface 40c of the light-transmitting layer 40A can be more effectively diffused between the light-diffusing layer 70 and the light-reflecting member 30A. As a result, the luminance of a region of the emission surface of the light-emitting element located between two adjacent light-emitting elements 20 can be enhanced, and therefore, the luminance non-uniformity of the emission surface can be reduced. In addition, the effect of improving light extraction efficiency can also be expected.

Figure 10:
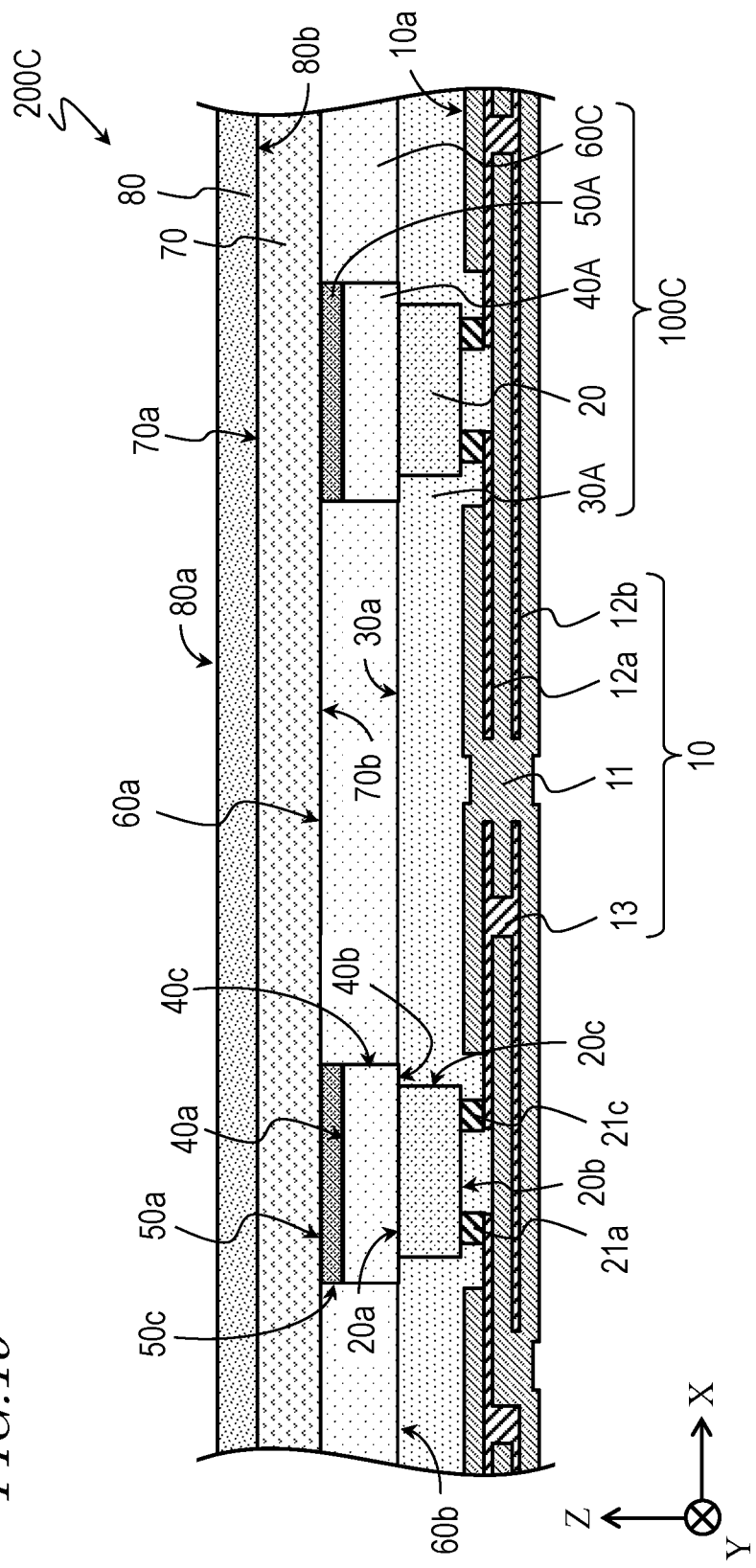
FIG. 10 is a schematic cross-sectional view showing an exemplary structure of a light-emitting device according to still another embodiment of the present disclosure.

The air layer is an example of the low-refractive-index layer 60A. As the low-refractive-index layer 60A, a layer formed of a material having a refractive index lower than that of the light-transmitting layer 40A may be disposed instead of the air layer. For example, a light-emitting device 200C shown in FIG. 10 has a light source section 100C on the wiring board 10. As shown in FIG. 10, the light source section 100C includes a low-refractive-index layer 60C located on the light-reflecting member 30A. The low-refractive-index layer 60C is formed of a material such as a resin having a refractive index lower than that of the base material for the light-transmitting layers 40A, and covers at least the lateral surfaces 40c of the light-transmitting layers 40A. In this example, the low-refractive-index layer 60C also covers the lateral surfaces 50c of the light-reflecting layers 50A, and the upper surface 50a of each light-reflecting layer 50A is selectively exposed form an upper surface 60a of the low-refractive-index layer 60C.

Wavelength Conversion Layer 80

As shown in FIGS. 1 and 9, the wavelength conversion layer 80 is disposed above the light-diffusing layer 70. A lower surface 80b of the wavelength conversion layer 80 may be in contact with the upper surface 70a of the light-diffusing layer 70, or there may be a space between the lower surface 80b of the wavelength conversion layer 80 and the upper surface 70a of the light-diffusing layer 70. Here, the wavelength conversion layer 80 is disposed in contact with the upper surface 70a of the light-diffusing layer 70.

The wavelength conversion layer 80 is typically formed of a material in which phosphor particles are dispersed in a resin. The wavelength conversion layer 80 absorbs at least a portion of light emitted from the light-emitting element 20 and transmitted through the light-diffusing layer 70, and emits light having a wavelength different from that of light emitted from the light-emitting element 20. For example, the wavelength conversion layer 80 converts the wavelength of a portion of blue light emitted from the light-emitting element and thereby outputs yellow light. With such a configuration, blue light transmitted through the wavelength conversion layer 80 and yellow light emitted from the wavelength conversion layer 80 are mixed together to obtain white light. The wavelength conversion layer 80 may have a thickness in the range of, for example, 100 μm or greater and 200 μm or less. The wavelength conversion layer 80 according to an embodiment of the present disclosure may have a thickness of, for example, about 100 μm.

As a base material in which particles of a phosphor or the like are dispersed, a silicone resin, modified silicone resin, epoxy resin, modified epoxy resin, urea resin, phenolic resin, acrylic resin, urethane resin, or fluorine resin, or a resin containing two or more of these resins, can be used. A light diffusion function may be imparted to the wavelength conversion layer 80 by dispersing, in the material of the wavelength conversion layer 80, a material having a refractive index different from that of the base material. For example, particles of titanium oxide, aluminum oxide, silicon oxide, zinc oxide, or the like may be dispersed in the base material of the wavelength conversion layer 80.

As the phosphor, a known material can be used. Examples of the phosphor include fluoride phosphors such as KSF phosphors, nitride phosphors such as CASN, YAG phosphors, and β-SiAlON phosphors. YAG phosphors are an example of a phosphor that converts blue light into yellow light. KSF phosphors and CASN are an example of a phosphor that converts blue light into red light. β-SiAlON phosphors are an example of a phosphor that converts blue light into green light.

The phosphor dispersed in the base material of the wavelength conversion layer 80 may be a quantum dot phosphor. In a typical embodiment of the present disclosure, the wavelength conversion layer 80 may be provided above the plurality of light-emitting elements 20, in the form of a phosphor layer that covers all of the light-emitting elements 20. Therefore, compared to a configuration in which a member containing a phosphor is separately disposed above each light-emitting element 20, a material having a high function such as a quantum dot phosphor can be easily used.

The wavelength conversion layer 80 may, for example, contain a plurality of types of phosphors each of which converts blue light into red light or green light. In that case, in the light-emitting device, blue light emitted from the light-emitting element 20 may be introduced into the wavelength conversion layer 80, whereby red light, blue light, and green light can be mixed together to emit white light.

With the above multilayer structure including the light-diffusing layer 70 and the wavelength conversion layer 80, light introduced into the low-refractive-index layer (the low-refractive-index layer 60A or 60C) can be diffused in the light-diffusing layer 70 before the light is introduced into the wavelength conversion layer 80. As a result, luminance non-uniformity can be reduced, advantageously resulting in even more uniform luminance.

Figure 11:
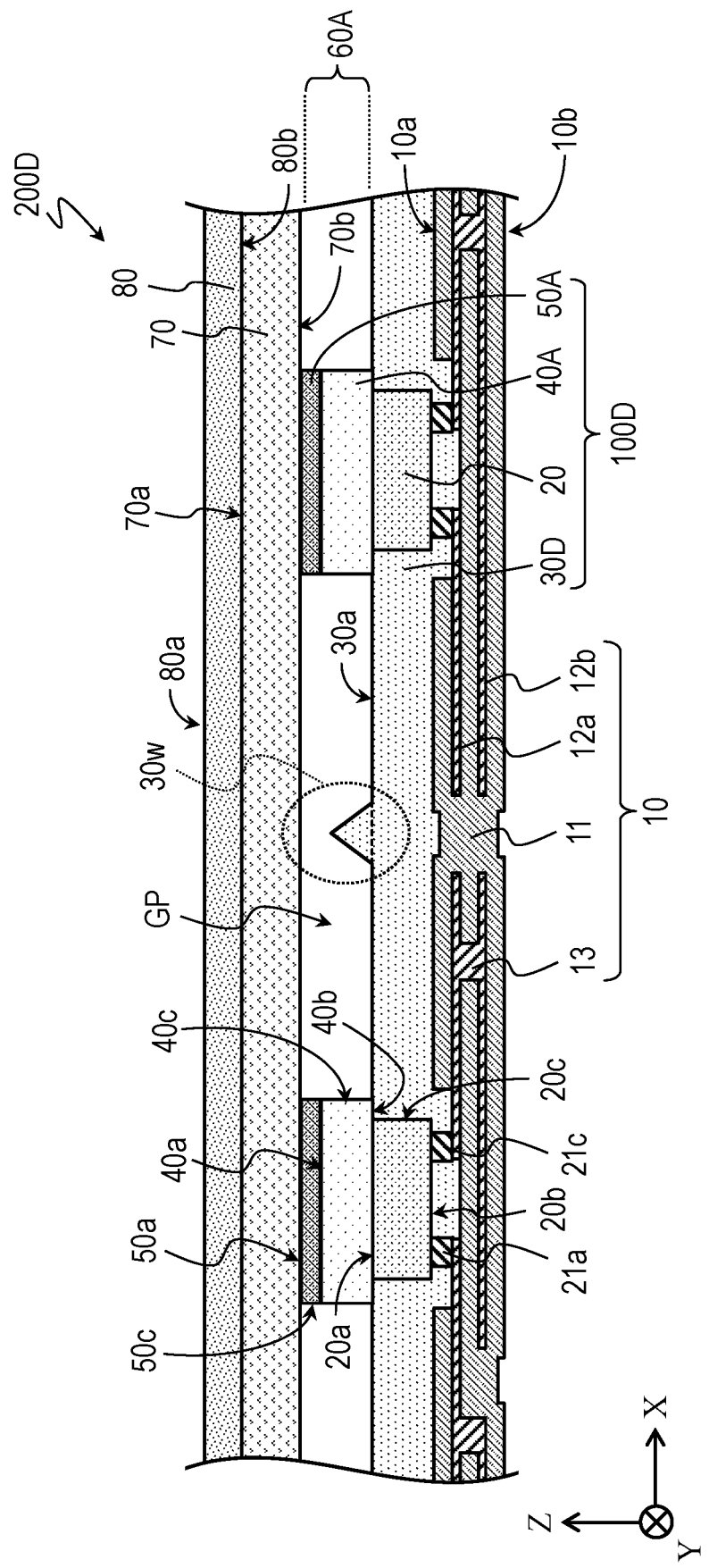
FIG. 11 is a schematic cross-sectional view showing an exemplary structure of a light-emitting device according to still another embodiment of the present disclosure.

FIG. 11 schematically shows an exemplary structure of a light-emitting device according to still another embodiment of the present disclosure. Compared to the light-emitting device 200A of FIG. 1, the light-emitting device 200D of FIG. 11 has a light source section 100D instead of the light source section 100A. The light source section 100D includes a light-reflecting member 30D having one or more protrusions 30w.

As shown in FIG. 11, the protrusion 30w is disposed on the upper surface 30a of the light-reflecting member 30D between two adjacent light-emitting elements 20. The protrusion 30w of FIG. 11 may have a wall-shaped structure extending in the Y direction of FIG. 11.

Figure 12:
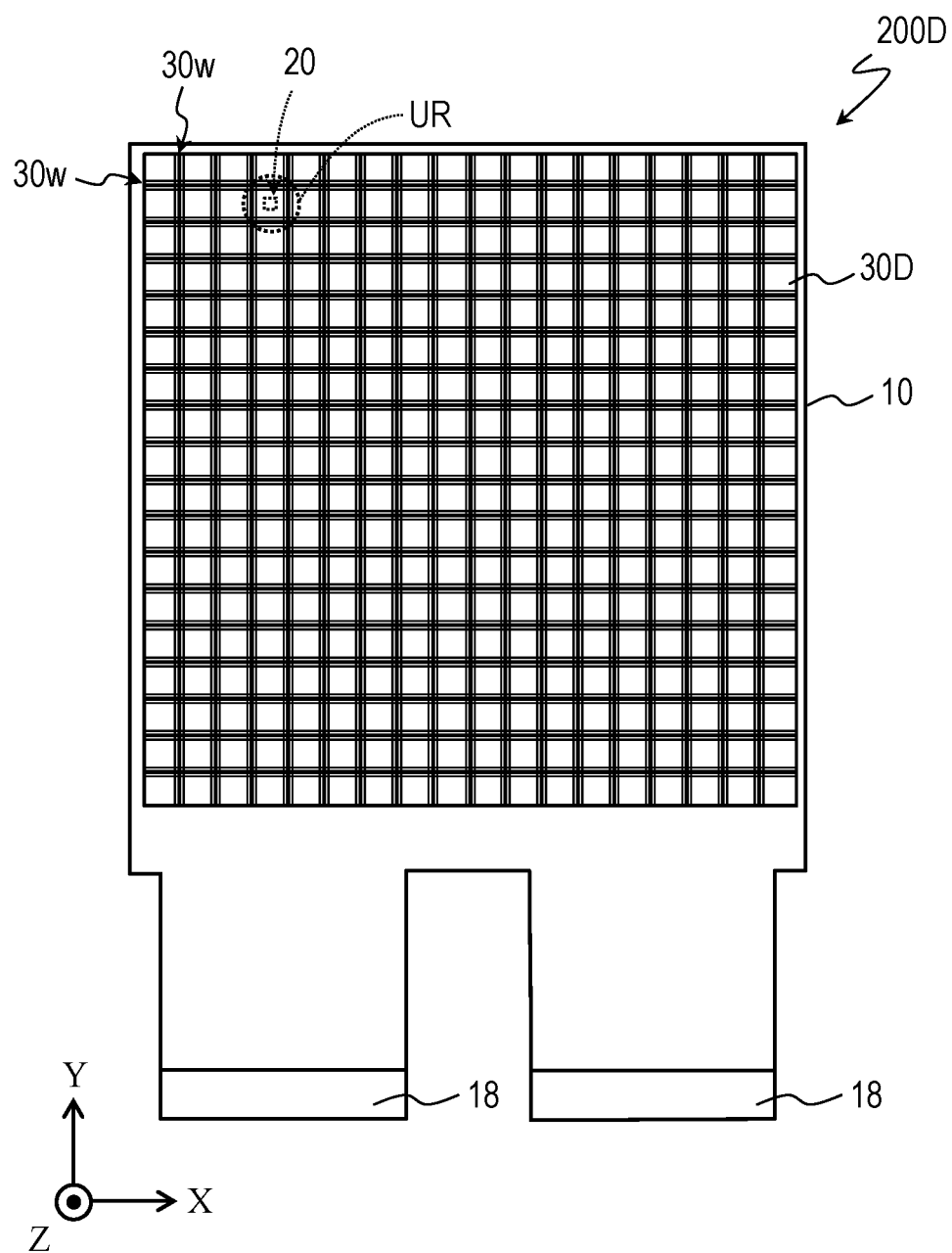
FIG. 12 is a schematic top view showing an exemplary arrangement of protrusions provided at an upper surface of a light source section.

FIG. 12 schematically shows an example arrangement of the protrusions 30w. In order to avoid unnecessarily obscuring the figure, an example arrangement of the protrusions 30w is here shown in which the light source section 100D has an array of 18 rows and 18 columns of unit regions UR. In the configuration of FIG. 12, the light-reflecting member 30D includes a plurality of protrusions 30w each of which extends in a straight line. Each protrusion 30w extends in the X or Y direction between two adjacent ones of the unit regions UR arranged in a two-dimensional array. In other words, the light-reflecting member 30D has a grid-like structure protruding toward the light-diffusing layer 70 at the upper surface 30a. Each protrusion 30w has a width of, for example, about 220 μm in a top plan view.

As shown in FIG. 12, the plurality of protrusions 30w may be provided on the upper surface 30a of the light-reflecting member 30D, surrounding each light-emitting element 20 in a top plan view. In this case, it can be said that the plurality of protrusion 30w define the unit regions UR, each of which contains a corresponding one of the plurality of light-emitting elements 20. Here, the unit region UR has a rectangular shape in a top plan view.

The protrusion 30w is, for example, formed of the same material for the light-reflecting member 30D, and thereby, has light reflectivity. Specifically, the protrusion 30w has the function of reducing introduction of light emitted from the light-emitting element 20 in one of two adjacent unit regions UR into the other unit region UR. Because the protrusions 30w are formed to surround the light-emitting element 20 in each unit region UR, light emitted from a unit region UR in which the light-emitting element 20 is on is substantially inhibited from entering another unit region UR adjacent to that unit region UR, for example. Thus, at the upper surface 80a of the wavelength conversion layer 80, the contrast ratio between a region directly above a unit region UR in which the light-emitting element 20 is on, and a region directly above a unit region UR in which the light-emitting element 20 is off, can be increased. The increase in contrast ratio between adjacent unit regions UR may be advantageous to use of local dimming.

A distance between a peak of the protrusion 30w (a highest portion of the protrusion 30w) and the upper surface 30a of the light-reflecting member 30D as a reference is in the range of, for example, 50% or greater and 100% or less of a distance between the upper surface 30a of the light-reflecting member 30D and the lower surface 70b of the light-diffusing layer 70. The protrusion 30w is advantageously formed to have a peak that reaches the lower surface 70b of the light-diffusing layer 70 in order to increase the contrast ratio between two adjacent unit regions UR.

Figure 13:
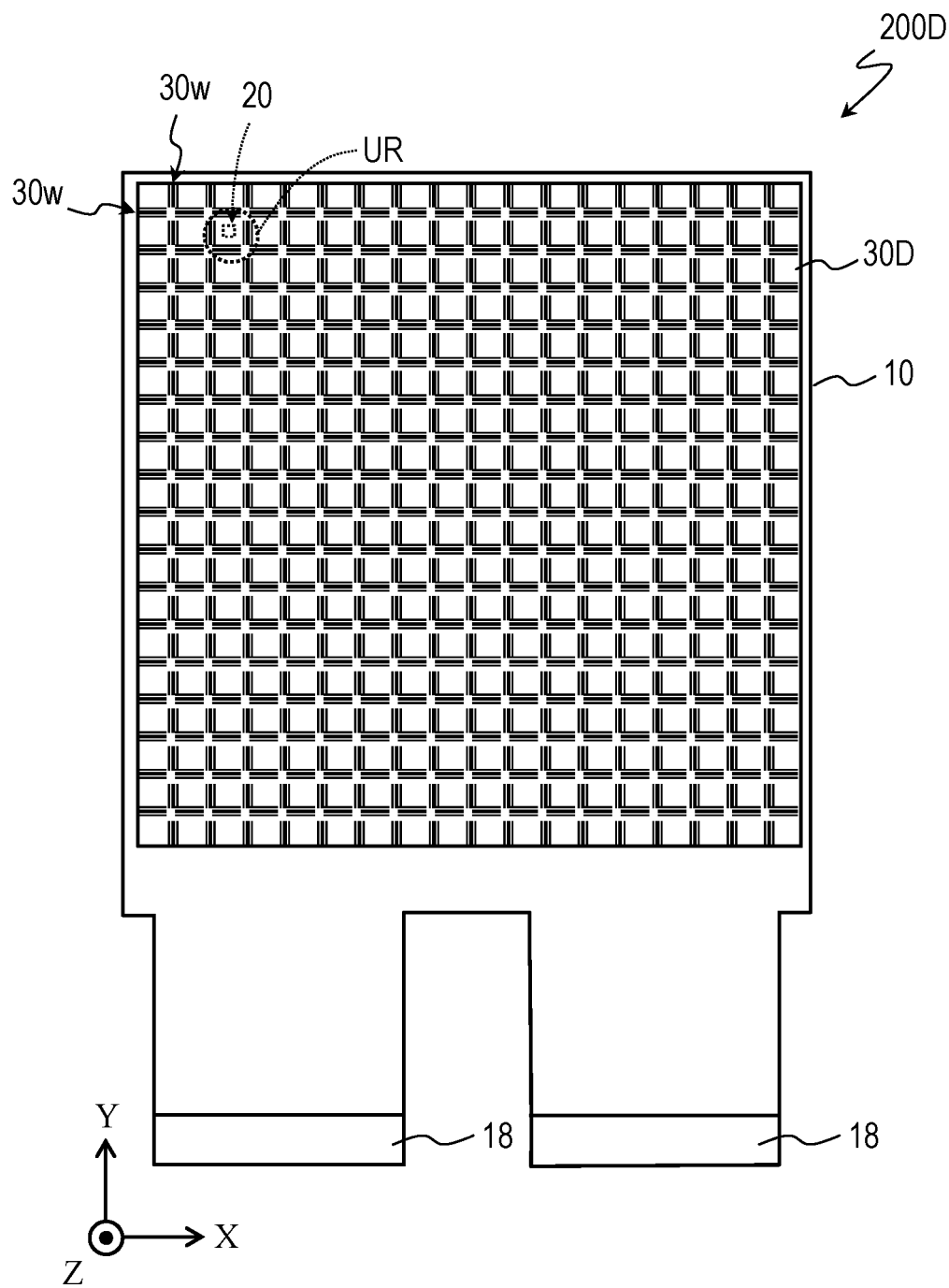
FIG. 13 is a schematic top view showing another exemplary arrangement of protrusions provided at an upper surface of a light source section.

In the example of FIG. 12, each protrusion 30w extends continuously in a straight line, in the X or Y direction, from one end to the other end of the light source section 100D. In contrast to this, in a configuration shown in FIG. 13, when referring to one of the unit regions other than the unit regions located at the outermost periphery of the two-dimensional array of unit regions UR, there are four protrusions 30w around the light-emitting element 20 contained in said unit region. The unit regions located at the outermost periphery of the two-dimensional array of unit regions UR may have a protrusion 30w outward of the light-emitting element 20 in a top plan view, or may have a region where no protrusion 30w is formed, at an outer edge thereof.

Figure 14:
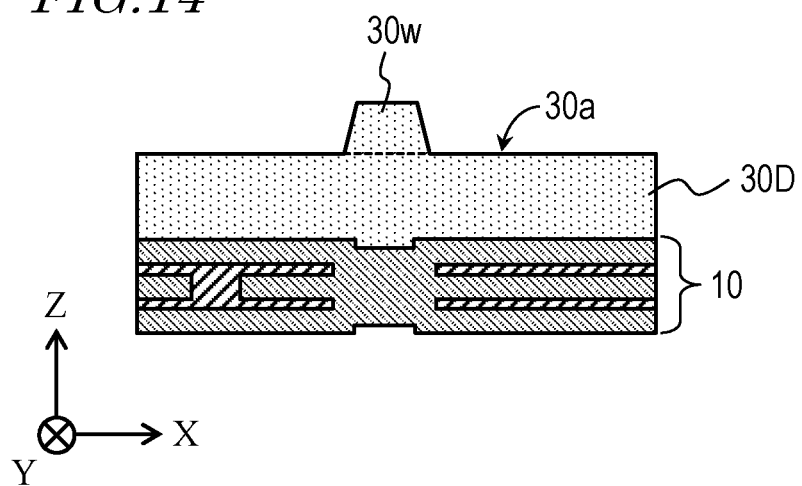
FIG. 14 is a schematic cross-sectional view showing another exemplary cross-sectional shape of a protrusion 30w.
Figure 15:
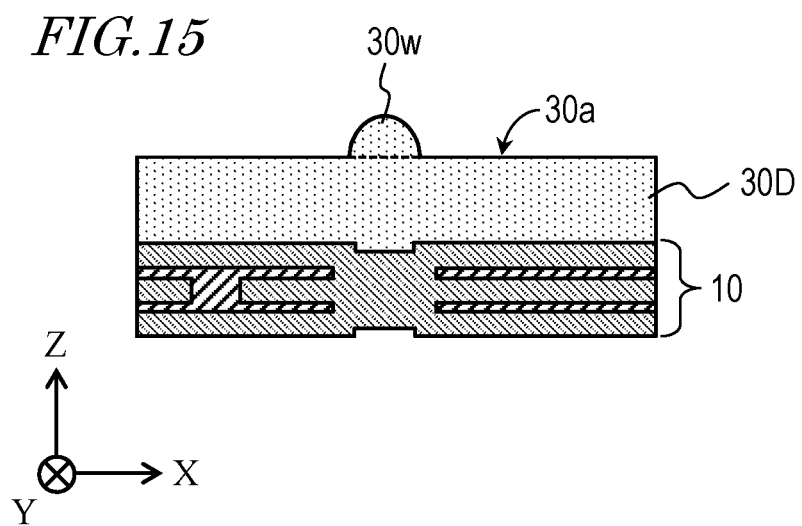
FIG. 15 is a schematic cross-sectional view showing still another exemplary cross-sectional shape of a protrusion 30w.

FIGS. 14 and 15 show another example cross-sectional shape of the protrusion 30w. The shape in a cross-sectional view of the protrusion 30w can be triangular as shown in FIG. 11, or alternatively, trapezoidal as shown in FIG. 14. The lateral surface of the protrusion 30w may be perpendicular to the upper surface 30a of the light-reflecting member 30D. In other words, the protrusion 30w may have a rectangular cross-sectional shape. The shape of one or more lateral surfaces defining the shape of the protrusion 30w is not limited to a flat shape, and may be a shape including a curved surface. For example, the protrusion 30w may have a semi-circular cross-sectional shape as shown in FIG. 15. The cross-sectional shape of the protrusion 30w may be semi-elliptical, unshaped, or the like. The shape in a cross-sectional view of the surface of the protrusion 30w is not limited to a straight line or arc, and may be any curved line, or a shape including a step or bend.

The protrusion 30w may be a portion of the light-reflecting member 30D. Alternatively, the protrusion 30w may be a member that is formed of the same or different material as or from that of the light-reflecting member 30D and is bonded to the upper surface 30a of the light-reflecting member 30D and is thereby provided on the light source section 100D. In the case in which the protrusion 30w is a member that is different from the light-reflecting member 30D and is disposed on the upper surface 30a, there may or may not be a definite boundary between the upper surface 30a of the light-reflecting member 30D and the protrusion 30w in a cross-section of the light source section 100D. The low-refractive-index layer 60C may be provided between the upper surface 30a of the light-reflecting member 30D and the lower surface 70b of the light-diffusing layer 70 to cover the protrusions 30w.

Instead of providing the protrusion 30w, a groove such as a V-groove may be formed at one or both of the upper and lower surfaces 60a and 60b of the low-refractive-index layer 60C. Alternatively, a light diffusion material may be dispersed in the low-refractive-index layer 60C such that the concentration of the light diffusion material is relatively high in a region of the low-refractive-index layer 60C between two adjacent light-emitting elements 20 in a top plan view. A light reflective material may be disposed inside the groove provided at the low-refractive-index layer 60C. Such a configuration can be expected to reduce leakage of light between two adjacent unit regions UR, and therefore, the effect of increasing the contrast ratio between the unit regions UR can be expected.

Figure 16:
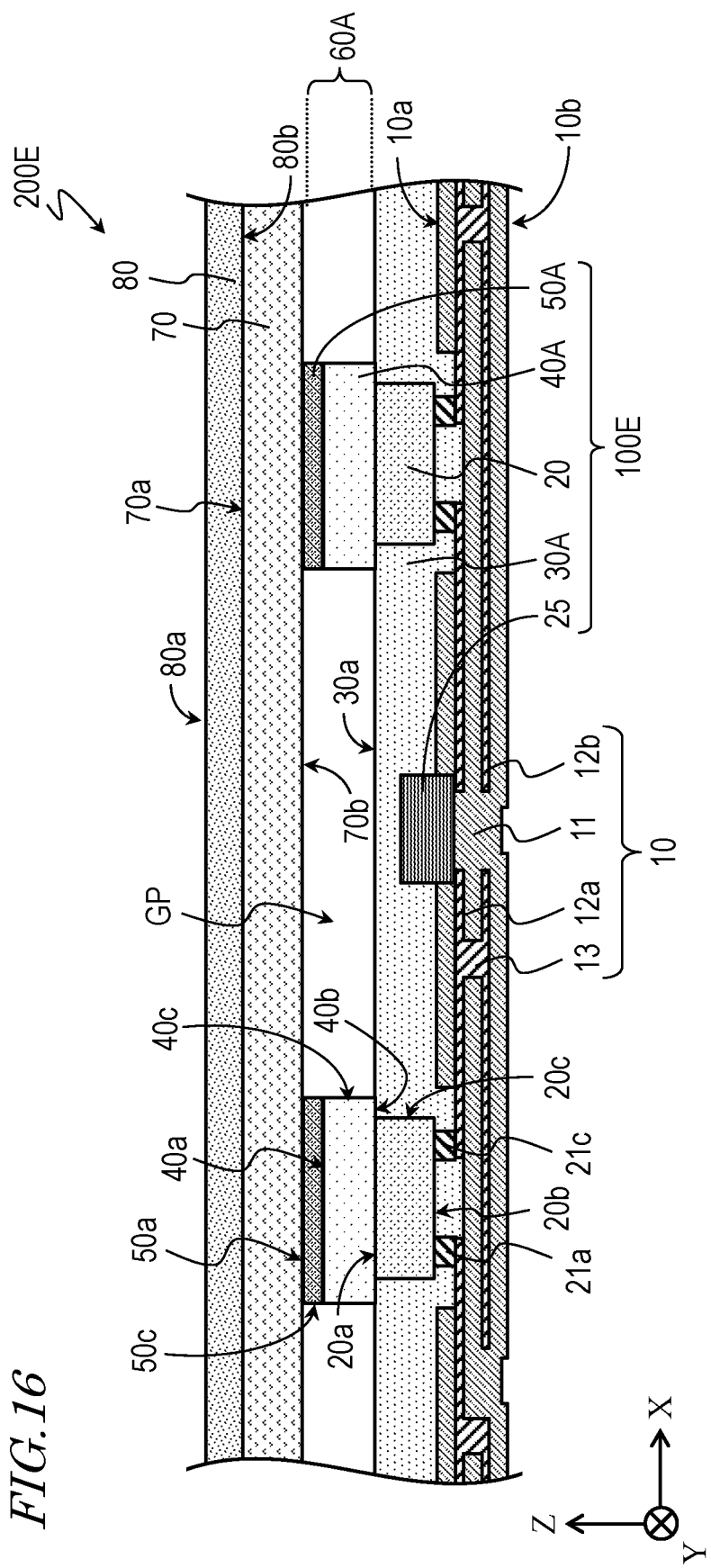
FIG. 16 is a schematic cross-sectional view showing an exemplary structure of a light-emitting device according to still another embodiment of the present disclosure.

FIG. 16 shows a light-emitting device according to still another embodiment of the present disclosure. Compared to the configuration described above with reference to FIG. 1, the light-emitting device 200E of FIG. 16 includes a circuit element that is electrically coupled to an interconnect layer of the wiring board 10 and is different from the light-emitting elements 20. In this example, a circuit element 25 is mounted together with the light-emitting elements 20 on the wiring board 10. The circuit element 25 is entirely covered by the light-reflecting member 30A. In other words, a light source section 100E of the light-emitting device 200E includes the circuit element 25 entirely embedded in the light-reflecting member 30A.

The circuit element 25 may, for example, be a driver, or a protective element such as a Zener diode, that is coupled to two or more light-emitting elements 20. In the case in which a protective element is disposed as the circuit element 25 on the wiring board 10, the circuit element 25 may be electrically coupled in series or parallel to the light-emitting element 20 in each unit region UR. In other words, the circuit element 25 may be mounted on the wiring board 10 for each unit region UR including the light-emitting element 20.

Because not only the plurality of light-emitting elements 20 but also circuit elements for driving the plurality of light-emitting elements 20 are mounted on the wiring board 10, the structure of an external control circuit coupled to the connector 18 can be simplified. In addition, because the circuit element 25 on the wiring board 10 is, for example, embedded in the light-reflecting member 30A of the light source section 100E, the absorption of light emitted from the light-emitting element 20 by the circuit element 25 can be reduced, and therefore, a decrease in light efficiency due to the mounting of the circuit element 25 on the wiring board 10 can be reduced.

Figure 17:
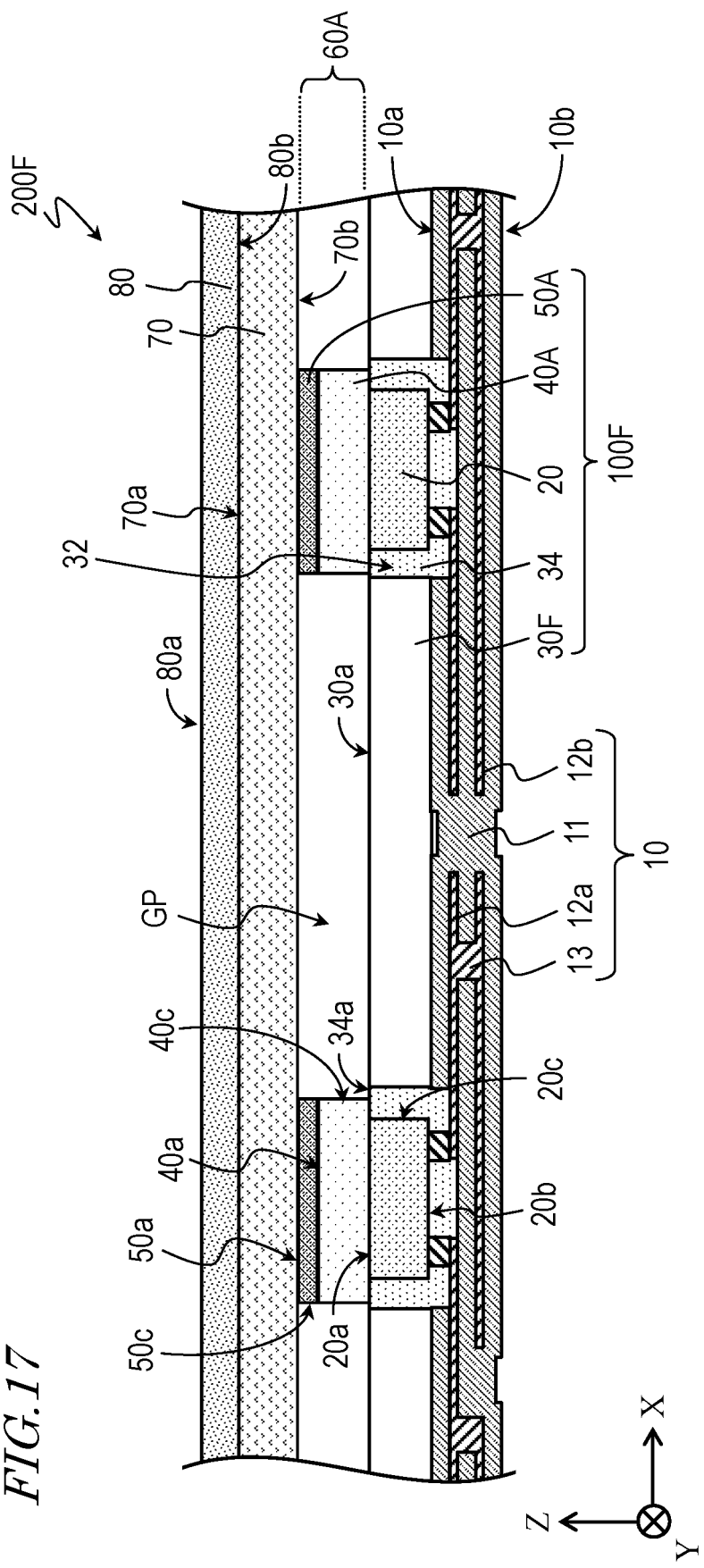
FIG. 17 is a schematic cross-sectional view showing an exemplary structure of a light-emitting device according to still another embodiment of the present disclosure.

FIG. 17 shows a light-emitting device according to still another embodiment of the present disclosure. Compared to the light-emitting device 200A of FIG. 1, the light-emitting device 200F of FIG. 17 has a light source section 100F instead of the light source section 100A. The light source section 100F of FIG. 17 is different from the light source section 100A of FIG. 1 mainly in that the light source section 100F includes a sheet-shaped light-reflecting member 30F having a plurality of through-holes 32, and sealing members 34 disposed inside the through-holes 32, instead of the light-reflecting member 30A.

As described below, the light-reflecting member 30A is formed by curing a resin material applied to the wiring board 10. In contrast to this, the light-reflecting member 30F of FIG. 17 is obtained by putting a light reflective resin sheet on the wiring board 10. As a material for the light-reflecting member 30F, a resin material in which a light reflective filler is dispersed in a base material such as polyethylene terephthalate (PET) can be used. For example, particles of titanium oxide may be dispersed as a light diffusion material in the base material of the light-reflecting member 30F. Instead of dispersing a light diffusion material in the base material, a white polyethylene terephthalate sheet containing a large number of bubbles may be obtained and used as the light-reflecting member 30F. In the case in which a resin sheet is used as the light-reflecting member 30F, the upper surface 30a of the light-reflecting member 30F is generally a flat surface.

The through-holes 32 of the light-reflecting member 30F are provided at positions corresponding to the plurality of light-emitting elements 20 on the wiring board 10. In the case in which a circuit element 25 is disposed on the wiring board 10 as in the example of FIG. 16, the light-reflecting member 30F may have a through-hole 32 at a position corresponding to the circuit element 25.

A material for the sealing member 34 may be a light transmitting resin material similar to that for the light-transmitting layer 40A or the like, or may be a light reflective resin material similar to that for the light-reflecting layer 50A or the like. A portion of the sealing member 34 may be located at a space between the lower surface 20b of the light-emitting element 20 and the upper surface 10a of the wiring board 10.

Figure 18:
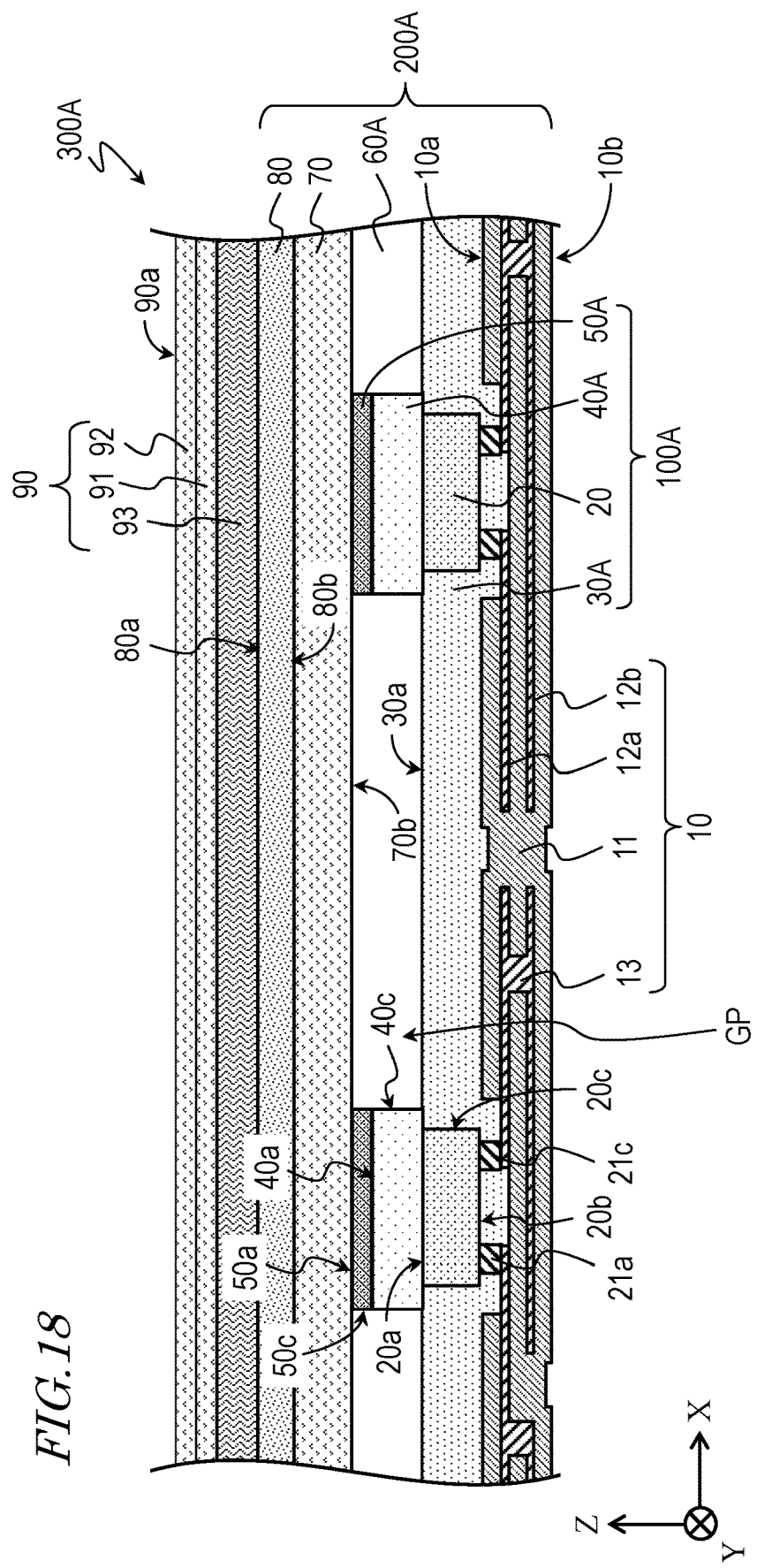
FIG. 18 is a schematic cross-sectional view showing an exemplary structure of a planar light source according to still another embodiment of the present disclosure.

FIG. 18 shows a planar light source according to still another embodiment of the present disclosure. The planar light source 300A of FIG. 18 has any of the light-emitting devices 200A to 200F, and a light-transmitting multilayer structure 90. In the configuration of FIG. 18, the light-transmitting multilayer structure 90 has a diffuser 93 and prism array layers 91 and 92. The light-transmitting multilayer structure 90 has, for example, a rectangular shape in a top plan view. FIG. 18 shows an example cross-sectional structure of the planar light source 300A that is obtained by putting the light-transmitting multilayer structure 90 on top of the light-emitting device 200A that has the cross-sectional structure of FIG. 1.

Diffuser 93

In the light-transmitting multilayer structure 90, the diffuser 93 is disposed above the light-diffusing layer 70 and the wavelength conversion layer 80. In this example, the diffuser 93 is located closer to the wavelength conversion layer 80 than are the prism array layers 91 and 92. In the planar light source 300A, the diffuser 93 may be spaced apart from the upper surface 80a of the wavelength conversion layer 80, or may be in direct contact with a portion of the upper surface 80a.

As with the light-diffusing layer 70, the diffuser 93 diffuses and transmits incident light. A structure that diffuses light is provided to the diffuser 93 by providing roughness to the surface of the diffuser 93, or dispersing a material having a different refractive index in the diffuser 93. Examples of a base material for the diffuser 93 include materials that absorb a small amount of visible light such as polycarbonate resins, polystyrene resins, acrylic resins, or polyethylene resins. As the diffuser 93, a commercially available optical sheet called a light diffuser sheet, diffuser film, or the like may be used. In this embodiment, because the light-diffusing layer 70 is located closer to the light source section 100A, the diffuser 93 having a simpler structure can be used in the light-transmitting multilayer structure 90. The diffuser 93 has a thickness of, for example, about 0.443 mm.

Prism Array Layers 91, 92

The prism array layers 91 and 92 are located above the diffuser 93. The prism array layers 91 and 92 each have a structure in which a plurality of prisms are arranged, each of which extends in a predetermined direction. For example, the prism array layer 91 has a plurality of prisms each extending in the Y direction, and the prism array layer 92 has a plurality of prisms each extending in the X direction.

The prism array layers 91 and 92 cause light beams coming from various directions to be refracted in a direction (in the figure, the positive Z direction) toward a display panel (not shown) disposed facing the light-emitting device 200A. As a result, light emitted from an upper surface 90a of the light-transmitting multilayer structure 90, which is the emission surface of the planar light source 300A, mainly contains more components that are perpendicular to the upper surface 90a (parallel to the Z axis). Therefore, luminance as measured when the planar light source 300A is viewed from the front (in the Z direction) can be increased.

As the prism array layers 91 and 92, a commercially available optical member for a backlight can be widely used. As the prism array layer 91 of the light-transmitting multilayer structure 90, for example, a prism film manufactured by 3M (model No. BEF4 DML) can be used. As the prism array layer 92, a prism film manufactured by 3M (model No. TBEF2 DT LS) can be used.

The prism array layers 91 and 92 may have a thickness of, for example, about 0.07 mm and about 0.09 mm, respectively. A structure in which the prism array layers 91 and 92 are put on top of each other is also hereinafter referred to as a "prism sheet." As the prism sheet, for example, an advanced structured optical composite (ASOC) manufactured by 3M can be used. The prism sheet may have a thickness of about 0.08 mm. Thus, the thickness of the prism sheet may be about half the thickness of a multilayer structure obtained by simply putting two prism array layers on top of each other. By using such a prism sheet, the planar light source 300A can be made thinner. The planar light source 300A having such a thin thickness is particularly useful for applications such as a smartphone. In the light-transmitting multilayer structure 90, the prism sheet may be in direction contact with the diffuser 93, or may be spaced apart from the diffuser 93.

The planar light source 300A may further have a reflective polarization layer (not shown) located above the prism array layer 92. For example, the reflective polarization layer selectively transmits light having the same polarization direction as that of a polarizing plate provided on the backlight of a liquid crystal display panel, and reflects polarized light having a direction perpendicular to that polarization direction toward the prism array layers 91 and 92. The polarization direction of a portion of the polarized light returning from the reflective polarization layer, when reflected again by the prism array layers 91 and 92 and the diffuser 93, is changed so that said portion is converted into polarized light having the polarization direction of the polarizing plate of the liquid crystal display panel, is introduced into the reflective polarization layer again, and is emitted toward the display panel. This allows for aligning the polarization direction emitted from the light-emitting device 200A. Therefore, light having such a polarization direction that is effective in enhancing the luminance of the display panel can be obtained with high efficiency.

A specification related to the thickness of a light-emitting device demanded on the market of video game machines, smartphones, and the like has in recent years been less than 2.0 mm. For example, a very extreme specification such as 1.5 mm or greater and 1.65 mm or less may be demanded. The light-emitting device according to an embodiment of the present disclosure can sufficiently meet such a requirement. Furthermore, because a layered structure including a light-transmitting layer and a light-reflecting layer is located directly above each light-emitting element 20, the luminance non-uniformity of light emitted from the emission surface of the light-emitting device can be effectively reduced.

Figure 19:
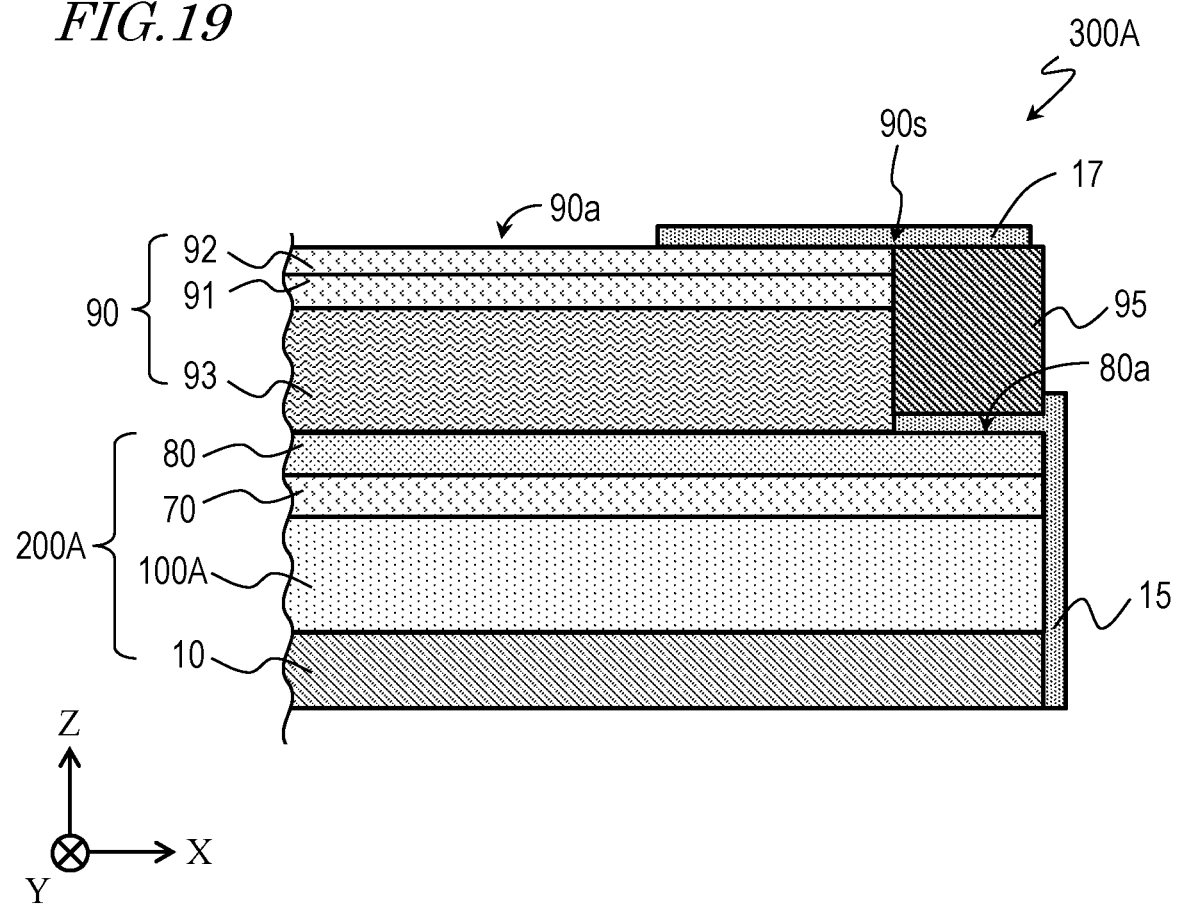
FIG. 19 is a cross-sectional view showing an edge portion of a light source section in a cross-sectional structure of a planar light source.

FIG. 19 schematically shows an edge portion of the light source section 100A in a cross-sectional structure of the planar light source 300A taken along line I-I of FIG. 2. In a configuration shown in FIG. 19, the wiring board 10 and the light source section 100A are fixed by a tape 15 that surrounds peripheries thereof. A portion of the tape 15 is formed in a frame shape along an edge of the upper surface 80a of the wavelength conversion layer 80 of the light source section 100A. A portion of the tape 15 that is located on the upper surface 80a of the wavelength conversion layer 80 serves as an adhesive layer, which fixes a rectangular frame 95 surrounding the periphery of the light-transmitting multilayer structure 90 to the light-emitting device 200A. In this example, a frame-shaped tape 17 is provided along and straddles a boundary 90s between the frame 95 and the light-transmitting multilayer structure 90, extending on the upper surface of the frame 95 and the upper surface 90a of the light-transmitting multilayer structure 90. As the tapes 15 and 17, for example, a double-sided tape manufactured by Nitto Denko Corporation (model No. 5606BN) can be used.

With such an assembly using a tape and a frame, a space in which a member for fixing the light source section 100A and the light-transmitting multilayer structure 90 to a predetermined position on the wiring board 10 is disposed can be removed from the wiring board 10. Therefore, the region where the light source section 100A is disposed can be extended to near the outer periphery of the wiring board 10. Thus, the region on the wiring board 10 can be maximally used to dispose the light source section 100A on the wiring board 10.

2. Method of Producing Light-Emitting Device 200A

Next, exemplary methods for producing a light-emitting device and planar light source according to an embodiment of the present disclosure will be described with reference to the drawings. In the description that follows, for example, an overview of methods for producing the light-emitting device 200A of FIG. 1 and the planar light source 300A of FIG. 18 will be described.

An FPC as the wiring board 10, and a plurality of light-emitting elements 20, are prepared. Next, as shown in FIG. 20, the light-emitting elements 20 are mounted on the wiring board 10. In order to enhance the bonding strength of the light-emitting elements 20 to the wiring board 10, a space between the lower surface 20b of the light-emitting element 20 and the upper surface 10a of the wiring board 10 may be filled with a resin material.

Next, the wiring board 10 with the light-emitting elements 20 mounted thereon is placed in a formwork, into which a photocurable resin material is injected by, for example, potting. By cuing the resin material applied to the wiring board 10 by irradiation with ultraviolet light, as shown in FIG. 21 the light-reflecting member 30A covering the lateral surface 20c of each light-emitting element 20 can be formed. At this time, for example, one or more recessed surfaces may be formed on the upper surface 30a of the light-reflecting member 30A due to sink marks caused by curing of the resin material. If the upper surface 30a has such recessed surfaces, the number of times reflection occurs between the light-diffusing layer 70 and the light-reflecting member 30A may increase, leading in an improvement in light extraction efficiency.

As described above with reference to FIG. 1, the light-emitting device 200A has the layered structure including the light-transmitting layer 40A and the light-reflecting layer 50A above each light-emitting element 20. Here, at any stage before the light-transmitting layer 40A and the light-reflecting layer 50A are disposed above the light-emitting elements 20, a plurality of sheet fragments each having a light-reflecting layer and a light-transmitting layer provided on the light-reflecting layer are prepared. The sheet fragments are, for example, commercially available. Alternatively, the sheet fragments may be prepared by executing a process illustrated below partially or completely.

For example, a sheet-shaped layered structure in which a light-transmitting layer is put on top of a light-reflecting layer is prepared. A material in which particles of a reflective material are dispersed in a resin is injected into a formwork, followed by curing, to obtain a sheet-shaped light-reflecting layer. Next, a material for a light-transmitting layer is applied to the light-reflecting layer to obtain a sheet-shaped layered structure. The layered structure is cut into square pieces with a side of, for example, 0.8 mm. Thus, the above plurality of sheet fragments are obtained.

Figure 22:
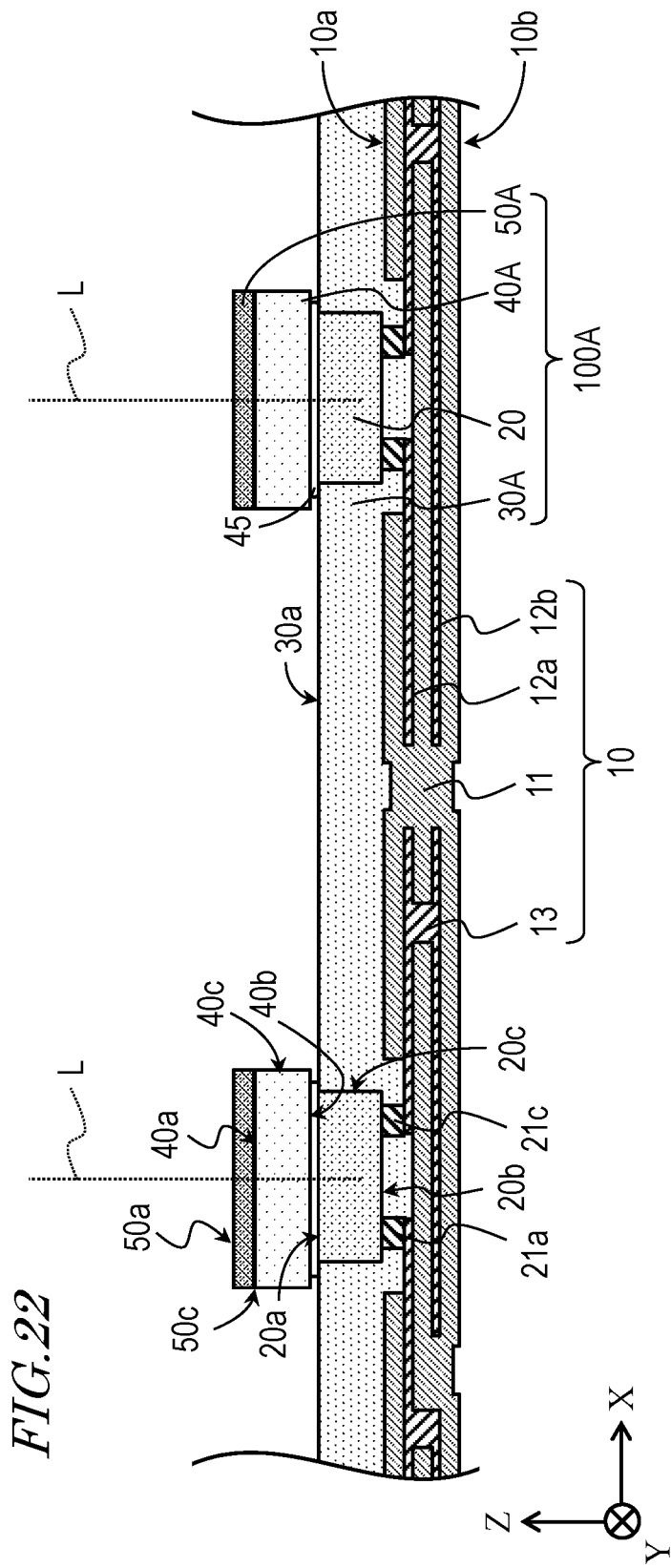
FIG. 22 is a cross-sectional view for describing an exemplary method of producing a light-emitting device according to an embodiment of the present disclosure.

After the formation of the light-reflecting member 30A, for example, an adhesive material is applied to the upper surface 20a of each light-emitting element 20, and as shown in FIG. 22, the sheet fragment is applied to each upper surface 20a. The sheet fragment can be disposed onto the upper surface 20a to which the adhesive material has been applied, using, for example, a die-bonding device (die bonder). At this time, the die bonding device aligns the sheet fragments such that the center of each sheet fragment is positioned on the optical axis L of a corresponding one of the light-emitting elements 20.

Thus, the multilayer structure including the plurality of light-transmitting layers 40A and the plurality of light-reflecting layers 50A can be formed directly above the plurality of light-emitting elements 20. As shown in FIG. 22, the light source section 100A may have an adhesive layer 45 located between the upper surface 20a of the light-emitting element 20 and the light-transmitting layer 40A.

Next, the light-diffusing layer 70 and the wavelength conversion layer 80 are disposed above the light source section 100A. The light-diffusing layer 70 and the wavelength conversion layer 80 may be supported above the light source section 100A by a frame provided on the wiring board 10, a housing for housing the wiring board 10, or the like. As a result, the low-refractive-index layer 60A located between the light-diffusing layer 70 and the light-reflecting member 30A can be formed. By the above steps, the light-emitting device 200A of FIG. 1 is obtained. Note that if, when the sheet-shaped layered structure including the light-reflecting layer and the light-transmitting layer is cut into a plurality of sheet fragments, the shape of the blade of a cutting tool therefor is suitably selected, the sheet fragment can, for example, have the light-transmitting layer 40X with the tilted lateral surface 40c as shown in FIG. 7.

After the plurality of multilayer structures each including the light-transmitting layer 40A and the light-reflecting layer 50A are disposed, the low-refractive-index layer 60C covering these multilayer structures may be formed. For example, after the plurality of multilayer structures are disposed and before the light-diffusing layer 70 and the wavelength conversion layer 80 are disposed, a light transmitting resin material is applied to the upper surface 30a of the light-reflecting member 30A, covering the plurality of multilayer structures. As a base material for the resin material applied to the light-reflecting member 30A, a material having a refractive index lower than that of a base material for the light-transmitting layer included in the multilayer structure is selected. By curing the resin material, as shown in FIG. 23 a low-refractive-index member 60 that covers all of the multilayer structures can be formed. Thereafter, if the low-refractive-index member 60 is polished or ground from the upper surface thereof until the upper surface 50a of the light-reflecting layer included in the multilayer structure is exposed, the low-refractive-index layer 60C covering the lateral surface of each multilayer structure can be formed from the low-refractive-index member 60. If the light-diffusing layer 70 and the wavelength conversion layer 80 are disposed so as to cover the low-refractive-index layer 60C, the light-emitting device 200C of FIG. 10 can be obtained.

If the circuit element 25 is mounted on the wiring board 10 before formation of the light-reflecting member 30A, the light-emitting device 200E of FIG. 16 is obtained. In addition, if, after the material for the light-reflecting member 30A is cured, the material for the light-reflecting member 30A is further applied to a surface of the cured material, in the shape of a line, using a dispenser or the like, and is then cured, the light-reflecting member 30D having the protrusions 30w of FIG. 11 or the like can be formed. Alternatively, for example, the protrusions 30w may be formed on the upper surface 30a by bonding a light reflective resin member formed in a grid shape to the upper surface 30a of the light-reflecting member 30A.

Instead of attaching the multilayer-structure sheet fragment to the upper surface 20a of each light-emitting element 20, the light-transmitting layer 40A may be disposed on the upper surface 20a, and thereafter, the light-reflecting layer 50A may be disposed on the light-transmitting layer 40A. If, after the light-transmitting layer 40A is bonded to the upper surface 20a of each light-emitting element 20 by an adhesive material or the like, a light reflective resin material is applied to the upper surface 40a of the light-transmitting layer 40A, and is then cured, or a resin sheet fragment formed of a resin material for the light-reflecting layer is attached to the upper surface 40a of the light-transmitting layer 40A, a structure is obtained which is similar to that which is obtained in the case in which the layered structure including the light-transmitting layer 40A and the light-reflecting layer 50A is disposed above the light-emitting element 20. If the light-reflecting layer 50B having an area greater than that of the upper surface 40a of the light-transmitting layer 40A is disposed on the light-transmitting layer 40A, as shown in FIG. 9 the light source section 100B including the light-reflecting layer 50B extending off the upper surface 40a of the light-transmitting layer 40A can be formed.

An optical member such as a diffuser is optionally disposed above the wavelength conversion layer 80. For example, as shown in FIG. 19, peripheries of the wiring board 10 and the light-emitting device 200A are covered by the tape 15. At this time, a portion of the tape 15 is disposed on the upper surface 80a of the wavelength conversion layer 80 along an edge of the wavelength conversion layer 80 of the light-emitting device 200A. As a result, a frame-shaped adhesive layer can be formed on the upper surface 80a of the wavelength conversion layer 80. Next, the frame 95 is fixed to the light-emitting device 200A by the adhesive layer.

Next, the light-transmitting multilayer structure 90 is disposed above the wavelength conversion layer 80 of the light-emitting device 200A, and is fixed to the light-emitting device 200A by the frame 95. Thereafter, the frame-shaped tape 17 is attached along the boundary between the frame 95 and the light-transmitting multilayer structure 90 that appears on the upper surface of the light-transmitting multilayer structure 90. Instead of fixation using the frame 95, the light-transmitting multilayer structure 90 may be fixed above the wavelength conversion layer 80 by laser welding. By the above steps, the planar light source 300A of FIG. 18 is obtained.

Instead of forming the light-reflecting member 30A by curing the resin material applied to the wiring board 10, the light source section 100F having the light-reflecting member 30F (see FIG. 17) may be obtained by disposing a resin sheet or the like on the wiring board 10. For example, after the light-emitting elements 20 are mounted on the wiring board 10, as shown in FIG. 24 a resin sheet having the through-holes at positions corresponding to the plurality of light-emitting elements 20 on the wiring board 10 may be disposed on the wiring board 10 by an adhesive sheet or the like. As a result, the light-reflecting member 30F having the through-holes 32 at positions corresponding to the plurality of light-emitting elements 20 can be disposed on the wiring board 10.

The resin sheet having the plurality of through-holes 32 is commercially available. Alternatively, after the resin sheet is produced or purchased, the through-holes 32 may be formed to prepare the resin sheet for forming the light-reflecting member 30F. The method of producing the through-holes 32 is not particularly limited. For example, the plurality of through-holes 32 can be formed in the resin sheet by punching to obtain the light-reflecting member 30F having the through-holes 32 at desired positions. Note that in the case in which the circuit element 25 is disposed on the wiring board 10, a through-hole 32 is formed at a position corresponding to the circuit element 25.

As shown in FIG. 25, the inside of each through-hole 32 is filled with a resin material. Thereafter, the resin material in the through-hole 32 can be cured to form the sealing member 34 in the through-hole 32. Here, an upper surface 34a of the sealing member 34 is aligned with the upper surface 20a of the light-emitting element 20. The upper surface 34a may be flush with the upper surface 20a. Note that in the case in which a resin sheet is used to form the light-reflecting member covering the lateral surface of each light-emitting element 20 on the wiring board 10, it is not essential to form the entire light-reflecting member on the wiring board 10 using the resin sheet and the resin material disposed in the through-holes 32 provided in the resin sheet. A portion of the light-reflecting member 30A or 30D may be replaced with the resin sheet and the sealing members 34 in the through-holes 32.

The upper surface 30a of the light-reflecting member 30F is generally a flat surface. In other words, the upper surface 30a of the light-reflecting member 30F does not generally have a recessed portion. If a resin material is applied in the shape of a line to a resin sheet and is then cured, or a line- or grid-shaped resin member is boned to a resin sheet, the protrusions 30w surrounding the light-emitting elements 20 in a top plan view can be formed on the upper surface 30a of the light-reflecting member 30F.

After the sealing member 34 is formed, as shown in FIG. 26 the light-transmitting layer 40A and the light-reflecting layer 50A are disposed above each light-emitting element 20. At this time, the light-transmitting layer 40A may be formed above the upper surface 20a of the light-emitting element 20 so as to cover the sealing member 34. In addition, the adhesive layer 45 may be interposed between the light-emitting element 20 and the light-transmitting layer 40A. Next, the light-diffusing layer 70 and the wavelength conversion layer 80 are disposed above the light source section 100F. By the above steps, the light-emitting device 200F of FIG. 17 is obtained. The light-transmitting multilayer structure 90 may optionally be further disposed above the wavelength conversion layer 80 of the light-emitting device 200F.

The light-emitting device and planar light source according to the present disclosure are useful for a backlight light source for a liquid crystal display, various illumination tools, and the like.

While certain embodiments of the present invention have been described with respect to exemplary embodiments thereof, it will be apparent to those skilled in the art that the disclosed invention can be modified in numerous ways and can assume many embodiments other than those specifically described above. Accordingly, it is intended by the appended claims to cover all modifications of the invention that fall within the true spirit and scope of the invention.

What is claimed is:

1. A light-emitting device comprising:
    a wiring board comprising an interconnect layer;
    a plurality of light-emitting elements disposed on the wiring board and electrically coupled to the interconnect layer of the wiring board;
    a light-reflecting member disposed on the wiring board and covering a lateral surface of each of the plurality of light-emitting elements;
    a plurality of light-transmitting layers each located above an emission surface of a corresponding one of the plurality of light-emitting elements;
    a plurality of light-reflecting layers disposed on the plurality of light-transmitting layers, respectively;
    a light-diffusing layer disposed above the plurality of light-reflecting layers and the light-reflecting member; and
    a low-refractive-index layer located between the light-reflecting member and the light-diffusing layer and around each pair of one of the plurality of light-transmitting layers and one of the plurality of light-reflecting layers, the low-refractive-index layer having a refractive index lower than that of the plurality of light-transmitting layers,
wherein
    each of the plurality of light-reflecting layers has a width in a cross-sectional view thereof which is equal to or greater than that of a corresponding one of the plurality of light-transmitting layers.

2. The light-emitting device according to claim 1, wherein in a top plan view, the plurality of light-reflecting layers overlay the plurality of light-transmitting layers, respectively, and in a top plan view, each of the plurality of light-transmitting layers encloses, within an outer periphery thereof, the emission surface of the corresponding one of the plurality of light-emitting elements.

3. The light-emitting device according to claim 2, wherein in a top plan view, each of the plurality of light-reflecting layers encloses, within an outer periphery thereof, a corresponding one of the plurality of light-transmitting layers.

4. The light-emitting device according to claim 2, wherein each of the plurality of light-reflecting layers has in a top plan view a dotted pattern having a dot density that becomes higher toward a center of each of the plurality of light-reflecting layers from an outside thereof.

5. The light-emitting device according to claim 3, wherein each of the plurality of light-reflecting layers has in a top plan view a dotted pattern having a dot density that becomes higher toward a center of each of the plurality of light-reflecting layers from an outside thereof.

6. The light-emitting device according to claim 1, wherein each of the plurality of light-transmitting layers has
an upper surface,
a lower surface located opposite to the upper surface, and
a lateral surface located between the upper surface and the lower surface, the lateral surface being tilted such that a distance between the lateral surface and an optical axis of the corresponding one of the plurality of light-emitting elements increases in a direction from a lower surface side toward an upper surface side.

7. The light-emitting device according to claim 2, wherein each of the plurality of light-transmitting layers has
an upper surface,
a lower surface located opposite to the upper surface, and
a lateral surface located between the upper surface and the lower surface, the lateral surface being tilted such that a distance between the lateral surface and an optical axis of the corresponding one of the plurality of light-emitting elements increases in a direction from a lower surface side toward an upper surface side.

8. The light-emitting device according to claim 3, wherein each of the plurality of light-transmitting layers has
an upper surface,
a lower surface located opposite to the upper surface, and
a lateral surface located between the upper surface and the lower surface, the lateral surface being tilted such that a distance between the lateral surface and an optical axis of the corresponding one of the plurality of light-emitting elements increases in a direction from a lower surface side toward an upper surface side.

9. The light-emitting device according to claim 4, wherein each of the plurality of light-transmitting layers has
an upper surface,
a lower surface located opposite to the upper surface, and
a lateral surface located between the upper surface and the lower surface, the lateral surface being tilted such that a distance between the lateral surface and an optical axis of the corresponding one of the plurality of light-emitting elements increases in a direction from a lower surface side toward an upper surface side.

10. The light-emitting device according to claim 1, further comprising:
a wavelength conversion layer located above the light-diffusing layer.

11. The light-emitting device according to claim 2, further comprising:
a wavelength conversion layer located above the light-diffusing layer.

12. The light-emitting device according to claim 3, further comprising:
a wavelength conversion layer located above the light-diffusing layer.

13. The light-emitting device according to claim 10, further comprising:
a plurality of protrusions located on an upper surface of the light-reflecting member and protruding toward the light-diffusing layer,
wherein
the plurality of protrusions surround each of the plurality of light-emitting elements in a top plan view.

14. The light-emitting device according to claim 11, further comprising:
a plurality of protrusions located on an upper surface of the light-reflecting member and protruding toward the light-diffusing layer,
wherein
the plurality of protrusions surround each of the plurality of light-emitting elements in a top plan view.

15. The light-emitting device according to claim 12, further comprising:
a plurality of protrusions located on an upper surface of the light-reflecting member and protruding toward the light-diffusing layer,
wherein
the plurality of protrusions surround each of the plurality of light-emitting elements in a top plan view.

16. The light-emitting device according to claim 13, wherein
the plurality of protrusions are integrally formed with the light-reflecting member.

17. The light-emitting device according to claim 14, wherein
the plurality of protrusions are integrally formed with the light-reflecting member.

18. The light-emitting device according to claim 15, wherein
the plurality of protrusions are integrally formed with the light-reflecting member.

19. The light-emitting device according to claim 1, further comprising:
at least one driver for driving the plurality of light-emitting elements,
wherein
the at least one driver is disposed on the wiring board and is covered by the light-reflecting member.

20. A planar light source comprising:
the light-emitting device according to claim 1;
a diffuser disposed above the light-diffusing layer; and
a prism sheet disposed above the diffuser.

* * * * *